United States Patent
Suzuki et al.

(10) Patent No.: US 11,979,170 B2
(45) Date of Patent: May 7, 2024

(54) ACCESSORY, METHOD OF CONTROLLING ACCESSORY, ELECTRONIC DEVICE, METHOD OF CONTROLLING ELECTRONIC DEVICE, COMMUNICATION SYSTEM, AND STORAGE MEDIUM

(71) Applicant: CANON KABUSHIKI KAISHA, Tokyo (JP)

(72) Inventors: Ryuta Suzuki, Kanagawa (JP); Yoshiro Ichihara, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 85 days.

(21) Appl. No.: 17/725,135

(22) Filed: Apr. 20, 2022

(65) Prior Publication Data

US 2022/0345156 A1 Oct. 27, 2022

(30) Foreign Application Priority Data

Apr. 23, 2021 (JP) ................................. 2021-073484

(51) Int. Cl.
| | |
|---|---|
| *G06F 11/10* | (2006.01) |
| *H03M 13/09* | (2006.01) |
| *H04L 1/00* | (2006.01) |
| *H04L 1/08* | (2006.01) |

(52) U.S. Cl.
CPC ........ *H03M 13/096* (2013.01); *H04L 1/0061* (2013.01); *H04L 1/08* (2013.01); *G06F 11/1004* (2013.01)

(58) Field of Classification Search
CPC . G06F 11/1004; H03M 13/096; H04L 1/0061
See application file for complete search history.

(56) References Cited

U.S. PATENT DOCUMENTS

| | | | |
|---|---|---|---|
| 11,409,688 B1 * | 8/2022 | Peterson | ............. G06F 13/4221 |
| 2021/0006353 A1 * | 1/2021 | Hoermaier | ............ H04L 1/0041 |

FOREIGN PATENT DOCUMENTS

| | | |
|---|---|---|
| JP | 05-158807 A | 6/1993 |
| JP | 08-204709 A | 8/1996 |
| JP | 2017-093712 A | 6/2017 |

* cited by examiner

*Primary Examiner* — Nadeem Iqbal
(74) *Attorney, Agent, or Firm* — Cowan, Liebowitz & Latman, P.C.

(57) ABSTRACT

An accessory and an electronic device enabling retransmission of data from the electronic device to the accessory when a checksum error occurs in the accessory. An accessory controller of the accessory determines whether or not a checksum received from the camera and a first checksum calculated from data received from the camera match. In a case where the checksums match, the accessory controller calculates a second checksum, whereas in a case where the checksums do not match, the accessory controller calculates a third checksum. The accessory controller transmits the second checksum or the third checksum to the camera according to a result of the determination.

27 Claims, 27 Drawing Sheets

FIG. 5

| | FIRST BTE | SECOND BYTE | THIRD BYTE | ... | (N-2)-TH BYTE | (N-1)-TH BYTE | N-TH BYTE |
|---|---|---|---|---|---|---|---|
| MOSI DATA | CMD | MOSI_DATA1 | MOSI_DATA2 | ... | MOSI_DATA[N-3] | CheckSum_C | 0x00 |
| MISO DATA | 0xA5 | CMD | MISO_DATA1 | ... | MISO_DATA[N-4] | 0x00 | CheckSum_A |

FIG. 6

| ADDRESS | D7 | D6 | D5 | D4 | D3 | D2 | D1 | D0 |
|---|---|---|---|---|---|---|---|---|
| 0x00 | ACC TYPE ||||||||
| 0x01 | ACC IDENTIFICATION NUMBER ||||||||
| 0x02 | FIRMWARE VERSION ||||||||
| 0x03 | POWER SUPPLY DURING POWER OFF | POWER SUPPLY IN ENERGY SAVING MODE ||||| POWER SUPPLY SPECIFICATION | CHARGE COMPATIBILITY |
| 0x04 | REQUESTED POWER ||||||||
| 0x05 | FIRMWARE UPDATE MODE | FIRMWARE UPDATE FUNCTION | PERMISSION OF OPERATION VIA INTERMEDIATE CONNECTION ACCESSORY ||| CHECK OF INTERMEDIATE CONNECTION ACCESSORY AT START-UP | COMPATIBILITY WITH I2C COMMAND COMMUNICATION ||
| 0x06 | RESERVE || COMMUNICATION REQUEST CAUSE ACQUISITION METHOD || FUNCTION SIGNAL 4 | FUNCTION SIGNAL 3 | FUNCTION SIGNAL 2 | FUNCTION SIGNAL 1 |
| 0x07 | RESERVED ||||||||
| 0x08 | RESERVED ||||||||
| 0x09 | RESERVED ||||||||
| 0x0A | SILENT START-UP | COMMUNICATION REQUEST CAUSE |||||||
| 0x0B | RESERVED ||||||||
| 0x0C | RESERVED |||||| SPIC PROTOCOL | CS LOGIC |
| 0x0D | COMMUNICATION INTERVAL BETWEEN SPI BYTES ||||||||
| 0x0E | COMMUNICATION INTERVAL BETWEEN SPI BYTES (IN FIRMWARE UPDATE MODE) ||||||||
| 0x0F | CHECKSUM ||||||||

*FIG. 8*

| NUMBER | TYPE |
|---|---|
| 0x00 | RESERVED |
| 0x01 | RESERVED |
| : | : |
| 0x80 | RESERVED |
| 0x81 | STROBE |
| 0x82 | INTERFACE CONVERSION ADAPTER |
| 0x83 | MICROPHONE |
| 0x84 | MULTI-ACCESSORY CONNECTION ADAPTER |
| 0x85 | RESERVED |
| 0x86 | RESERVED |
| 0x87 | RESERVED |
| 0x88 | RESERVED |
| 0x89 | RESERVED |
| 0x90 | RESERVED |
| : | : |
| 0xFF | RESERVED |

FIG. 9

| CAUSE NUMBER | DETAILS OF CAUSE |
|---|---|
| 0x00 | DEPRESSION OF MENU CALL SW |
| 0x01 | COMPLETION OF AUDIO STABILIZATION |
| 0x02 | TERMINATION OF MUTING OF AUDIO |
| 0x03 | |
| 0x04 | |
| 0x05 | |
| 0x06 | |
| 0x07 | |
| ⋮ | |
| 0x79 | |
| 0x7A | |
| 0x7B | |
| 0x7C | |
| 0x7D | |
| 0x7E | |
| 0x7F | |

FIG. 10A

|   | COMMUNICATION INTERVAL |
|---|---|
| 0 | 1μs |
| 1 | 2μs |
| 2 | 5μs |
| 3 | 10μs |
| 4 | 15μs |
| 5 | 25μs |
| 6 | 50μs |
| 7 | 100μs |

FIG. 10B

|   | COMMUNICATION INTERVAL |
|---|---|
| 0 | 1ms |
| 1 | 2ms |
| 2 | 5ms |
| 3 | 10ms |
| 4 | 20ms |
| 5 | 50ms |
| 6 | 80ms |
| 7 | 100ms |

*FIG. 14*

| | FIRST BYTE | SECOND BYTE | THIRD BYTE | ... | (N-1)-TH BYTE | N-TH BYTE |
|---|---|---|---|---|---|---|
| MOSI DATA | CMD | MOSI_DATA1 | MOSI_DATA2 | ... | MOSI_DATA[N-2] | CheckSum_C |
| MISO DATA | 0xA5 | CMD | MISO_DATA1 | ... | MISO_DATA[N-3] | CheckSum_A |

FIG. 17

| ADDRESS | D7 | D6 | D5 | D4 | D3 | D2 | D1 | D0 |
|---|---|---|---|---|---|---|---|---|
| 0x00 | ACC TYPE ||||||||
| 0x01 | ACC IDENTIFICATION NUMBER ||||||||
| 0x02 | FIRMWARE VERSION ||||||||
| 0x03 | POWER SUPPLY DURING POWER OFF | POWER SUPPLY IN ENERGY SAVING MODE || POWER SUPPLY SPECIFICATION ||| CHARGE COMPATIBILITY ||
| 0x04 | REQUESTED POWER ||||||||
| 0x05 | FIRMWARE UPDATE MODE | FIRMWARE UPDATE FUNCTION | PERMISSION OF OPERATION VIA INTERMEDIATE CONNECTION ACCESSORY | CHECK OF INTERMEDIATE CONNECTION ACCESSORY AT START-UP | FUNCTION SIGNAL 4 | FUNCTION SIGNAL 3 | COMPATIBILITY WITH I2C COMMAND COMMUNICATION | FUNCTION SIGNAL 1 |
| 0x06 | RESERVE | RESERVE | COMMUNICATION REQUEST CAUSE ACQUISITION METHOD | COMMUNICATION REQUEST CAUSE |||||
| 0x07 | RESERVED ||||||||
| 0x08 | RESERVED ||||||||
| 0x09 | RESERVED ||||||||
| 0x0A | SILENT START-UP |||||||| 
| 0x0B | RESERVED ||||||||
| 0x0C | RESERVED ||||||| SPIC PROTOCOL | CS LOGIC |
| 0x0D | COMMUNICATION INTERVAL BETWEEN SPI BYTES ||||||||
| 0x0E | COMMUNICATION INTERVAL BETWEEN SPI BYTES (IN FIRMWARE UPDATE MODE) ||||||||
| 0x0F | COMMAND ||||||||

FIG. 20

| ADDRESS | D7 | D6 | D5 | D4 | D3 | D2 | D1 | D0 |
|---|---|---|---|---|---|---|---|---|
| 0x00 | ACC TYPE ||||||||
| 0x01 | ACC IDENTIFICATION NUMBER ||||||||
| 0x02 | FIRMWARE VERSION ||||||||
| 0x03 | POWER SUPPLY DURING POWER OFF | FIRMWARE UPDATE FUNCTION | POWER SUPPLY IN ENERGY SAVING MODE | | POWER SUPPLY SPECIFICATION ||| CHARGE COMPATIBILITY |
| 0x04 | REQUESTED POWER ||||||||
| 0x05 | FIRMWARE UPDATE MODE | RESERVED | PERMISSION OF OPERATION VIA INTERMEDIATE CONNECTION ACCESSORY | CHECK OF INTERMEDIATE CONNECTION ACCESSORY AT START-UP | | COMPATIBILITY WITH I2C COMMAND COMMUNICATION |||
| 0x06 | RESERVED | RESERVED | COMMUNICATION REQUEST CAUSE ACQUISITION METHOD | FUNCTION SIGNAL 4 | FUNCTION SIGNAL 3 | FUNCTION SIGNAL 2 | FUNCTION SIGNAL 1 |
| 0x07 | RESERVED ||||||||
| 0x08 | RESERVED ||||||||
| 0x09 | RESERVED ||||||||
| 0x0A | SILENT START-UP | COMMUNICATION REQUEST CAUSE |||||||
| 0x0B | CHECKSUM AT TIME OF TWO-BYTE READING ||||||||
| 0x0C | RESERVED | SPIC PROTOCOL | CS LOGIC ||||||
| 0x0D | COMMUNICATION INTERVAL BETWEEN SPI BYTES ||||||||
| 0x0E | COMMUNICATION INTERVAL BETWEEN SPI BYTES (IN FIRMWARE UPDATE MODE) ||||||||
| 0x0F | [7-0] COMMAND & CHECKSUM FOR EEPROM PRODUCT (CHECKSUM AT TIME OF 15-BYTE READING) ||||||||

READING START ADDRESS

| CAMERA TRANSMISSION DATA | S | SLAVE ADDR. | W | - | 0x00 | - | S | SLAVE ADDR. | R | |
|---|---|---|---|---|---|---|---|---|---|---|
| ACCESSORY TRANSMISSION DATA | - | - | - | A | - | A | - | - | - | |

FIRST BYTE ... 15-TH BYTE CHECKSUM

| | | | | N | P |
|---|---|---|---|---|---|
| - | ... | - | - | - | - |
| DATA0 | ... | DATA14 | - | CheckSumI2C_A | - |
| A | ... | A | - | - | - |

READING START ADDRESS

| CAMERA TRANSMISSION DATA | S | SLAVE ADDR. | W | - | 0x09 | - | S | SLAVE ADDR. | R | |
|---|---|---|---|---|---|---|---|---|---|---|
| ACCESSORY TRANSMISSION DATA | - | - | - | A | - | A | - | - | - | |

FIRST BYTE SECOND BYTE CHECKSUM

| | | | N | P |
|---|---|---|---|---|
| - | - | - | - | - |
| DATA9 | DATA10 | - | CheckSumI2C_A | - |
| A | A | - | - | - |

ACCESSORY, METHOD OF CONTROLLING ACCESSORY, ELECTRONIC DEVICE, METHOD OF CONTROLLING ELECTRONIC DEVICE, COMMUNICATION SYSTEM, AND STORAGE MEDIUM

BACKGROUND OF THE INVENTION

Field of the Invention

The disclosure relates to an accessory communicably connected to an electronic device, a method of controlling the same and a storage medium therefor, the electronic device, a method of controlling the same and a storage medium therefor, and a communication system including the electronic device and the accessory.

Description of the Related Art

As a method of performing serial communication between electronic devices, there has been conventionally employed unidirectional communication (e.g. I2C (registered trademark) communication) and bidirectional communication (e.g. SPI (registered trademark) communication). Two electronic devices performing serial communication therebetween are categorized into an electronic device that perform communication by delivering clocks for communication (hereafter referred to as "the master device") and an accessory that performs communication by receiving the clocks from the master device (hereafter referred to as "the slave device").

In each of the master device and the slave device, a method called checksum can be used as a method for determining whether received data is correct or not. In a case where checksums do not match in the slave device, by performing notification (slave request) other than the serial communication from the slave device, it is possible to perform the same communication again.

As a technique using a checksum, Japanese Laid-Open Patent Publication (Kokai) No. H8-204709 discloses a method of differentiating a time interval of transmission of data from a slave device to a master device, between transmission data and a checksum. Further, Japanese Laid-Open Patent Publication (Kokai) No. 2017-93712 discloses a method of comparing a received checksum and a calculated checksum and abandoning received data in a case where respective values thereof are different. Further, Japanese Laid-Open Patent Publication (Kokai) No. H5-158807 discloses a method of changing, whenever a checksum is updated, an address where the checksum is to be written according to the number of times of writing the checksum.

However, in a case where the number of pins of a microcomputer mounted in an electronic device is insufficient and in a case where the size of the electronic apparatus is to be reduced, a slave request sometimes cannot be prepared. In such a device, in a case where an error of a mismatch between the values of the received checksum and the calculated checksum occurs in the slave device, other communication means is required for requesting the master drive to perform retransmission of data. Therefore, the configuration and control of the slave device are made complicated. Further, in a case where the slave device cannot use the checksum function, it is impossible for each of the master device and the slave device to determine whether received data is correct.

SUMMARY OF THE INVENTION

In a first aspect of the embodiments, there is provided an accessory that transmits and receives data to and from an electronic device by serial communication, including at least one processor, and a memory coupled to the at least one processor, the memory having instructions that, when executed by the processor, perform the operations as: a calculation unit configured to calculate a checksum, a determination unit configured to determine whether or not a checksum received from the electronic device and a first checksum calculated by the calculation unit from data received from the electronic device match, a control unit configured to calculate a second checksum by the calculation unit in a case where the checksum received from the electronic device and the first checksum match, and calculate a third checksum by the calculation unit in a case where the checksum received from the electronic device and the first checksum do not match, and a transmission unit configured to transmit the second checksum or the third checksum according to a result of determination by the determination unit.

In a second aspect of the embodiments, there is provided an accessory that transmits and receives data to and from an electronic device by serial communication, including at least one processor, and a memory coupled to the at least one processor, the memory having instructions that, when executed by the processor, perform the operations as: a calculation unit configured to calculate a checksum, a determination unit configured to determine whether or not a checksum received from the electronic device and a first checksum calculated by the calculation unit from data received from the electronic device match, a control unit configured to calculate a second checksum by the calculation unit in a case where the checksum received from the electronic device and the first checksum match, and notify a checksum error to the electronic device by changing an output level at a communication terminal for the serial communication in a case where the checksum received from the electronic device and the first checksum do not match, and a transmission unit configured to transmit the second checksum to the electronic device in the case where the checksum received from the electronic device and the first checksum match.

In a third aspect of the embodiments, there is provided an accessory that transmits and receives data to and from an electronic device by serial communication, including at least one processor, and a memory coupled to the at least one processor, the memory having instructions that, when executed by the processor, perform the operations as: a calculation unit configured to calculate a checksum, a determination unit configured to determine whether or not a checksum received from the electronic device and a first checksum calculated by the calculation unit from data received from the electronic device match, a control unit configured to calculate a second checksum by the calculation unit in a case where the checksum received from the electronic device and the first checksum match, and notify a checksum error to the electronic device by starting over communication with the electronic device in a case where the checksum received from the electronic device and the first checksum do not match, and a transmission unit configured to transmit the second checksum to the electronic device in the case where the checksum received from the electronic device and the first checksum match.

In a fourth aspect of the embodiments, there is provided an accessory that transmits and receives data to and from an electronic device by serial communication, including at least one processor, and a memory coupled to the at least one processor, the memory having instructions that, when executed by the processor, perform the operations as: a calculation unit configured to calculate a checksum, a determination unit configured to determine whether or not a checksum received from the electronic device and a first checksum calculated by the calculation unit from data received from the electronic device match, a control unit configured to calculate a second checksum by the calculation unit in a case where the checksum received from the electronic device and the first checksum match, and notify a checksum error to the electronic device by resetting the accessory in a case where the checksum received from the electronic device and the first checksum do not match, and a transmission unit configured to transmit the second checksum to the electronic device in the case where the checksum received from the electronic device and the first checksum match.

In a fifth aspect of the embodiments, there is provided an accessory that transmits and receives data to and from an electronic device by serial communication, including a storage unit configured to store accessory information, the storage unit including a first area configured to store a first checksum which is a checksum of the whole of the accessory information, and a second area configured to store a second checksum which is a checksum of part of the accessory information, wherein the first area is set to an end of an area of the storage unit, for storing the accessory information, wherein the second area is set to a predetermined area of the storage unit excluding the end of the area for storing the accessory information, and wherein the second checksum is a fixed value.

In a sixth aspect of the embodiments, there is provided an electronic device that transmits and receives data to and from an accessory by serial communication, including at least one processor, and a memory coupled to the at least one processor, the memory having instructions that, when executed by the processor, perform the operations as: a calculation unit configured to calculate a checksum of data transmitted to the accessory, a transmission unit configured to transmit the data and the checksum to the accessory, and a control unit configured to, in a case where during one communication of a predetermined number of bytes, after transmitting the checksum to the accessory, a checksum received from the accessory indicates a checksum error, transmit the data to the accessory again.

Further features of the disclosure will become apparent from the following description of exemplary embodiments (with reference to the attached drawings).

BRIEF DESCRIPTION OF THE DRAWINGS

FIG. 5 is a diagram showing an example of operation execution commands issued from the camera to the accessory.

FIG. 6 is a diagram showing an example of accessory information stored in the accessory.

FIG. 8 is a diagram showing an example of information showing types of accessories.

FIG. 9 is a diagram for explaining causes of notification of a communication requesting signal from the accessory to the camera.

FIGS. 10A and 10B are diagrams showing examples of time intervals of communication bytes in SPI communication.

FIG. 14 is a diagram showing another example of operation execution commands issued from the camera to the accessory.

FIG. 17 is a diagram showing another example of accessory information stored in the accessory.

FIG. 20 is a diagram showing accessory information stored in the accessory shown in FIG. 19.

DESCRIPTION OF THE EMBODIMENTS

The disclosure will now be described in detail below with reference to the accompanying drawings showing embodiments thereof. Here, an image capturing apparatus is described as an electronic device according to the disclosure. An accessory communicably connected to the image capturing apparatus is not particularly limited, insofar as it is capable of communicating with the image capturing apparatus. As the accessory, there may be mentioned a lighting device (strobe device or the like), a display device (electronic viewfinder or the like), an audio device (microphone device or the like), and so forth.

The image capturing apparatus and the accessory form an image capturing system (communication system) in which the image capturing apparatus functions as a master device while the accessory functions as a slave device.

Figure 1:
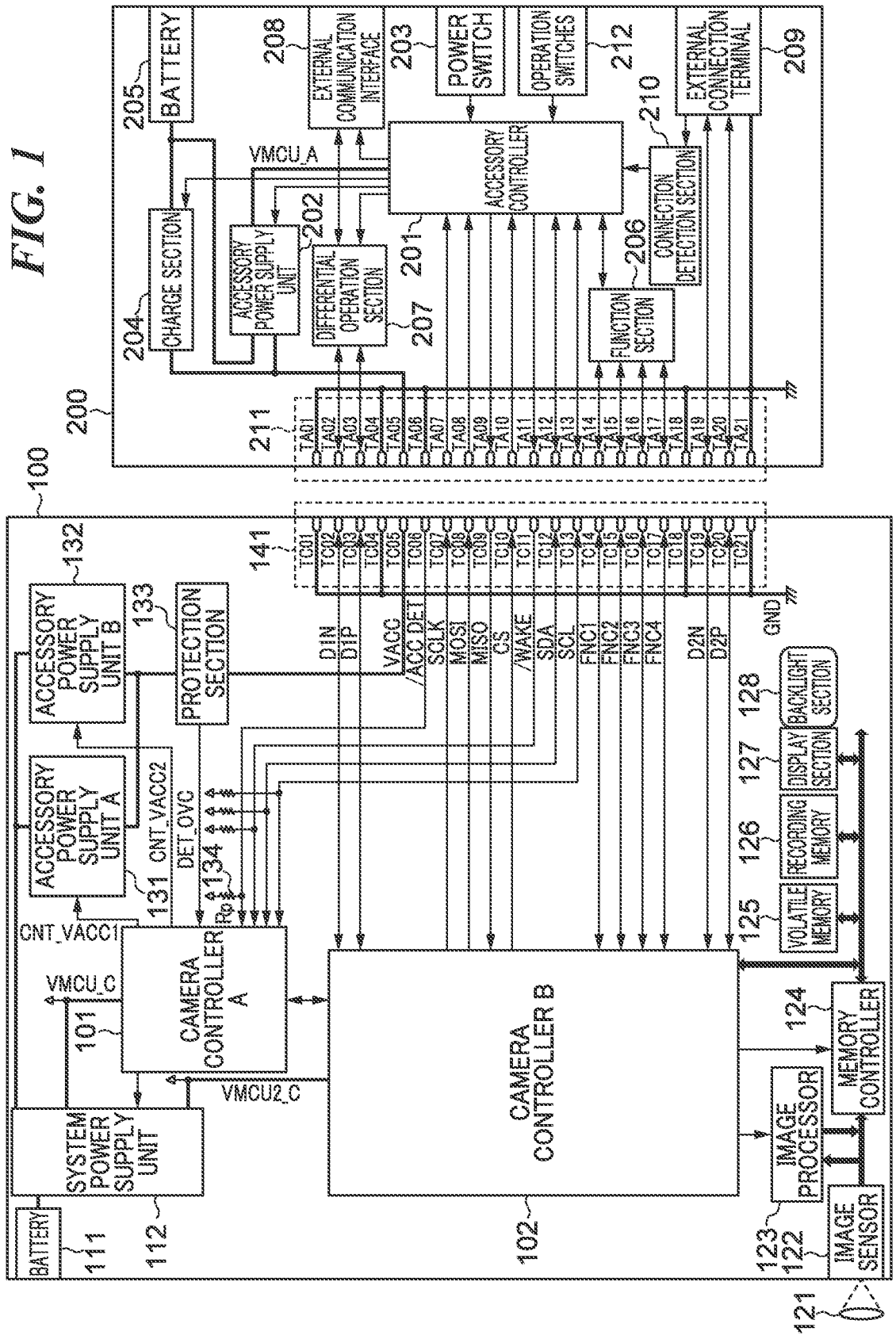
FIG. 1 is a block diagram showing respective electrical configurations of a camera and an accessory.

FIG. 1 is a block diagram showing respective electrical configurations of the image capturing apparatus (hereafter referred to as "the camera"), denoted by reference numeral 100, and the accessory, denoted by reference numeral 200. The camera 100 is comprised of a camera controller A 101, a camera controller B 102, a battery 111, a system power supply unit 112, an image sensor 122, an image processor 123, a memory controller 124, a volatile memory 125, a recording memory 126, and a display section 127. Further, the camera 100 is comprised of a backlight section 128, an accessory power supply unit A 131, an accessory power supply unit B 132, a protection section 133, and a camera connection section 141.

The battery 111 supplies electrical power to components of the camera 100. The battery 111 is removably mounted on the camera 100. The camera controller A 101 and the camera controller B 102 are circuits (control units) each formed by a microcomputer containing a CPU and the like. The camera controller A 101 monitors a switch and the like as components of an operation section operated by a user, and operates even when the camera 100 is in a standby state, even performing power supply control and the like in response to operations by a user. The camera controller B 102 is responsible for control of the image sensor 122, the display section 127, and the like. Note that the standby state refers to a state in which the power of the camera 100 is on but the electrical consumption of the camera 100 is suppressed (low electrical consumption mode). After the camera 100 is powered on, when a predetermined time period elapses without any external operation on the camera 100, the camera 100 shifts to the standby state. Note that, in the present embodiment, the description is given of a configuration in which the camera controller A 101 and the camera controller B 102 are formed by respective separate processors, but they may be provided in a single processor.

The system power supply unit 112 is comprised of a DC-DC converter circuit, a low dropout (LDO) circuit, and a charge pump circuit, and so forth, and generates electrical power to be supplied to components of the camera 100. A voltage of 1.8 V generated by the system power section 112 is always supplied as a camera microcomputer power supply VMCU_U to the camera controller A 101. Further, several types of voltages generated by the system power supply unit 112 are supplied to the camera controller B 102 as a microcomputer power supply VMCU 2_C at a desired timing. By controlling the system power supply unit 112, the camera controller A 101 performs on/off control of power supply to components of the camera 100.

An optical lens 121 (so-called exchangeable lens) is removably attached to the camera 100. Note that the optical lens 121 may be provided integrally with (unremovably attached to) the camera 100. Light incident through the optical lens 121 from an object (incident light) forms an image on an image forming surface (imaging surface) of the image sensor 122 formed by a CMOS sensor, a CCD sensor, or the like. Note that the optical lens 121 and the camera 100 may be integrally formed with each other. The image sensor 122 encodes an object image (optical image) formed on the imaging surface into digital imaging signals. The image processor 123 generates image data by performing noise reduction processing, white balance processing, and the like, on the imaging signals, and converts the generated image data into an image file in a JPEG format or the like so as to store the image data in the recording memory 126. Further, the image processor 123 generates VRAM image data for display on the display section 127 from the generated image data.

The memory controller 124 controls transmission and reception of image data and other data generated by the image processor 123 and the like. The volatile memory 125 is a memory capable of reading and writing at high speed, such as a DDR3SDRAM, and is used for a work space for image processing performed by the image processor 123. The recording memory 126 is a recording medium that is removably attached to the camera 100 via a connection section, not shown, such as an SD card and a CF express card. The display section 127 is a display disposed on a rear side of the camera 100 and is formed by an LCD panel, an organic EL display, or the like. The backlight section 128 adjusts the brightness of the display section 127 by changing the amount of backlight of the display section 127.

The accessory power supply unit A 131 and the accessory power supply unit B 132 convert a voltage supplied from the system power supply unit 112 to a predetermined voltage, and in the present embodiment, generates 3.3 V as an accessory power supply VACC, but may be configured to convert the supplied voltage to a voltage other than this. The accessory power supply unit A 131 is a small power unit that is comprised of an LDO circuit and small in self consumption power. The accessory power supply unit B 132 is a power unit that is comprised of a DC-DC converter and capable of supplying larger current than the accessory power supply unit A 131. Note that the self-consumption power of the accessory power supply unit B 132 is larger than that of the accessory power supply unit A 131. Therefore, in a case where load current is small, the accessory power supply unit A 131 is higher in efficiency than the accessory power supply unit B 132. The camera controller A 101 controls switching of on/off of the accessory power supply unit A 131 and the accessory power supply unit B 132 depending on an operating state of the accessory 200.

The protection section 133 is formed by a current fuse element, a PolySwitch (registered trademark) device, an electronic fuse circuit formed by combining a resistor, an amplifier, and a switch element, or the like. The protection section 133 outputs an overcurrent detection signal DET_OVC in a case where the value of a power source current supplied from the accessory power supply unit A131 and the accessory power supply unit B 132 exceeds a predetermined value and hence is excessively large (abnormal). In the present embodiment, the protection section 133 is an electronic fuse circuit and notifies the overcurrent detection signal DET_OVC to the camera controller A 101 in a case where an electric current larger than 1 A flows. The overcurrent detection signal DET_OVC is a signal that indicates overcurrent when the signal goes high. Note that the predetermined value (current value) is not limited to 1 A.

The camera 100 and the accessory 200 are electrically connected to each other through one-to-one contact between a plurality of contacts (terminals) TC01 to TC21 of the camera connection section 141 of the camera 100 and a plurality of contacts (terminals) TA01 to TA21 of an accessory connection section 211 of the accessory 200.

The camera connection section 141 is a connector for electrically connecting to the accessory 200 via the twenty-one contacts TC01 to TC21 arranged in a line. The contacts TC01 to TC21 are arranged in this order from one end to the other end.

A contact TC01 as a third ground contact of the camera connection section 141 is connected to ground (GND), and plays not only the role of a contact of a reference potential but also the role of controlling wiring impedance of a differential signal DIN and a differential signal DIP. A contact TC02 and a contact TC03 are connected to the camera controller B 102, and the differential signal DIN is connected to the contact TC02 while the differential signal DIP is connected to the contact TC03. The differential signal DIN and the differential signal DIP are differential data communication signals that form a pair to perform data communication. Note that the contact TC02, the contact 03, contacts 07 to 17, 19, and 20 are communication contacts.

A contact TC04 as a first ground contact is connected to ground and serves as a contact of a reference potential for the camera 100 and the accessory 200. The accessory power supply VACC generated by the accessory power supply units A 131 and B 132 are connected via the protection section 133 to a contact TC05 as a power supply contact. The contact TC04 is disposed at a location outward of the contact TC05 in an arrangement direction of the contacts.

An accessory mounting detection signal/ACC_DET is connected to a contact TC06 as a mounting detection contact. The accessory mounting detection signal/ACC_DET is pulled up via a resistance element Rp134 (e.g. 10 KΩ) to the camera microcomputer power supply VMCU_U. The camera controller A 101 is capable of detecting whether or not the accessory 200 has been mounted by reading the level of the accessory mounting detection signal/ACC_DET. When the level (potential) of the accessory mounting detection signal/ACC_DET is at a high level (predetermined potential or higher), it is detected that the accessory has not been mounted, whereas when the same is at a low level (GND potential), it is detected that the accessory 200 has been mounted.

A change in the signal level of the accessory mounting detection signal/ACC_DET from the high level to the low level occurring when the camera 100 is powered on servers as a trigger to perform a variety of communications between the camera 100 and the accessory 200 via the contacts.

The camera controller A 101 supplies power to the accessory 200 via the contact TC05 as the power supply contact, according to detection that the accessory 200 has been mounted.

An SCLK signal, an MOSI signal, an MISO signal, and a CS signal are signals that are connected to a contact TC07, a contact TC08, a contact TC09, and a contact TC10 are signals for SPI communication which is a type of serial communication performed by the camera controller B 102 as a communication master. In the present embodiment, SPI communication is assumed to be performed with a communication clock frequency of 1 MHz, a data length of eight bits (one byte), a bit order with MSB first, and a full-duplex communication method.

In the present embodiment, the camera 100 and the accessory 200 are assumed to be compatible with the two types of the SPI communication method. A first communication protocol is a method in which the camera 100 does not check whether or not the accessory 200 is in a state capable of communication, before outputting an SCLK signal, and this method is hereafter referred to as "the SPI protocol A".

Figure 2A:
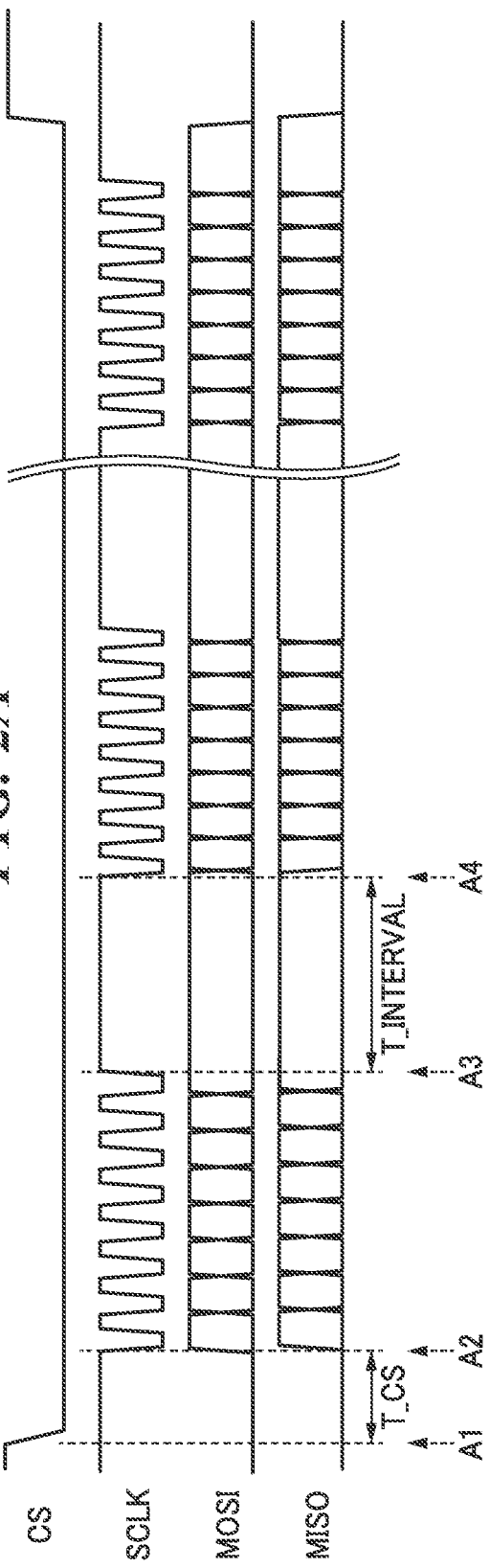
FIGS. 2A and 2B are diagrams schematically showing waveforms of two types of SPI protocols of a SPI communication method.

FIG. 2A is a diagram schematically showing waveforms of communication of the SPI protocol A. In FIG. 2A, the CS signal is low-active (active when at a low level). At a timing A1, the camera controller B 102 changes the CS signal to the low level, thereby requesting the accessory controller 201 to perform SPI communication. At a timing A2 at which a predetermined time period T_CS has elapsed after the timing A1, the camera controller B 102 starts outputting the SCLK signal and the MOSI signal. Similarly, when the accessory controller 201 (details of which will be described hereinafter) of the accessory 200 detects a falling edge of the SCLK signal, the accessory controller 201 starts outputting the MISO signal.

The camera controller B 102 stops outputting the SCLK signal at a timing A3 at which outputting of the SCLK signal for one byte of data is completed. Then, the camera controller B 102 refrains from outputting the SCLK signal until a predetermined time period T_INTERVAL elapses from the timing A3, and at a timing A4 at which the predetermined time period T_INTERVAL has elapsed, the camera controller B 102 resumes outputting the SCLK signal to perform communication of the next one byte.

Figure 3A:
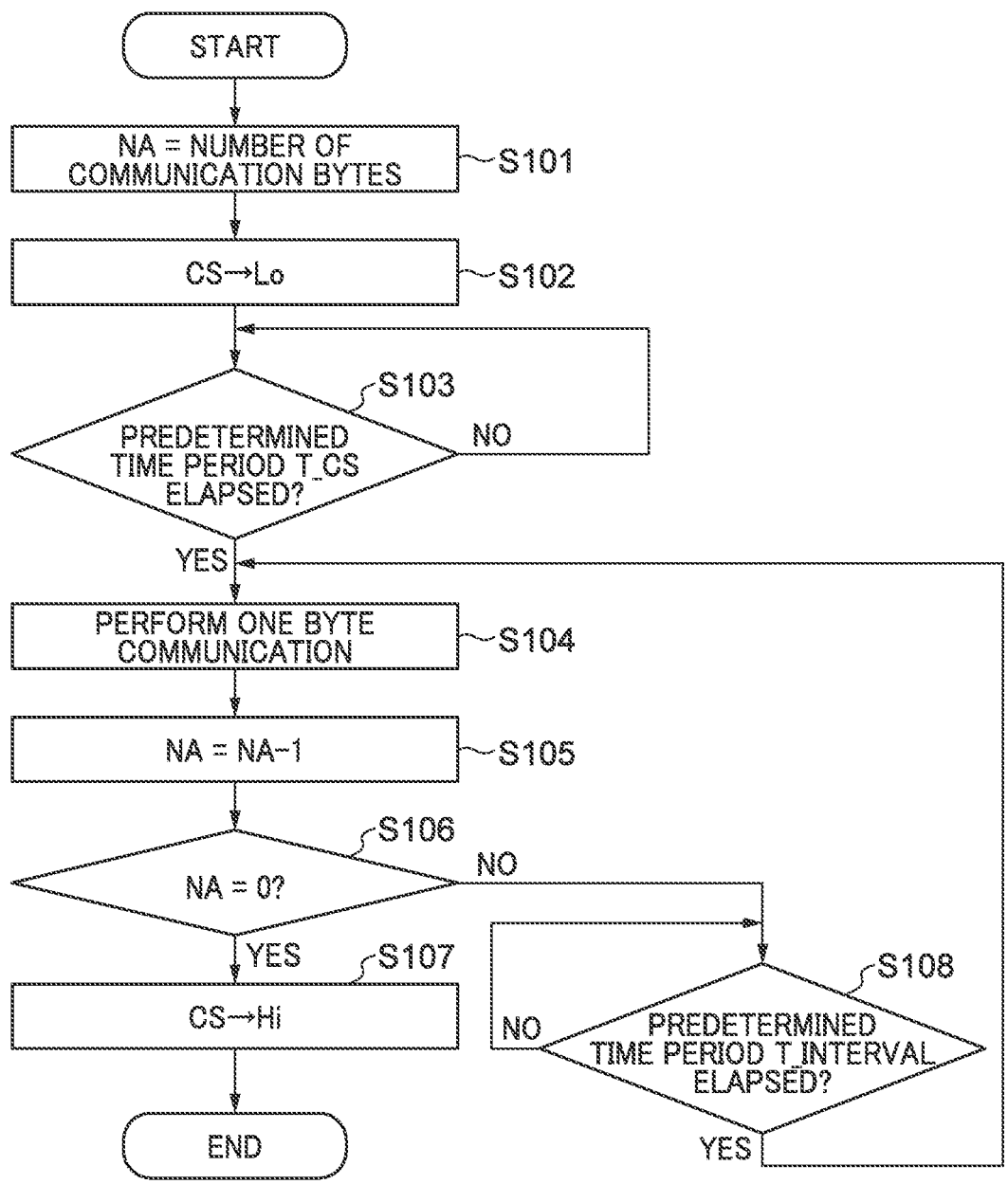
FIGS. 3A and 3B are flowcharts of operations performed by a camera controller and an accessory controller according to a first communication protocol.

FIG. 3A is a flowchart useful in explaining operations performed by the camera controller B 102 according to the SPI protocol A. In FIG. 3A, each processing operation (step) indicated by S number is realized by the CPU of the camera controller B 102, which loads a predetermined program stored in a ROM, not shown, of the camera controller B 102 into a RAM, not shown, of the same.

In a step S101, the camera controller B 102 stores a value indicative of the number of bytes for communication as a variable NA. For example, when performing communication of three bytes, the variable NA is set to a value of 3. In a step S102, the camera controller B 102 requests SPI communication by changing the CS signal to the low level. In a step S103, the camera controller B 102 determines whether or not the predetermined time period T_CS has elapsed after the CS signal was changed to the low level. The camera controller B 102 waits (No to the step S103) until the predetermined time period T_CS elapses, and when the camera controller B 102 determines that the predetermined time period T_CS has elapsed (Yes to the step S103), the process proceeds to a step S104.

In the step S104, to perform communication of one byte of data, the camera controller B 102 performs SCLK signal output control while performing output control of MOSI signal data and input control of MISO signal data. In a step S105, the camera controller B 102 decrements the value of the variable NA. In a step S106, the camera controller B 102 determines whether or not the variable NA is equal to 0 (zero). In a case where the camera controller B 102 determines that the variable NA is equal to 0 (zero) (Yes to the step S106), the process proceeds to a step S107, whereas in a case where the camera controller B 102 determines that the variable NA is not equal to 0 (No to the step S106), the process proceeds to a step S108.

In the step S108, the camera controller B 102 determines whether or not a predetermined time period T_INTERVAL has elapsed after completion of communication of one byte of data in the step S104. The camera controller B 102 waits (No to the step S108) until the predetermined time period T_INTERVAL elapses, and when the camera controller B 102 determines that the predetermined time period T_INTERVAL has elapsed (Yes to the step S108), the process returns to the step S104. In the step S107, the camera controller B 102 changes the CS signal to the high level, thereby terminating SPI communication.

Figure 3B:
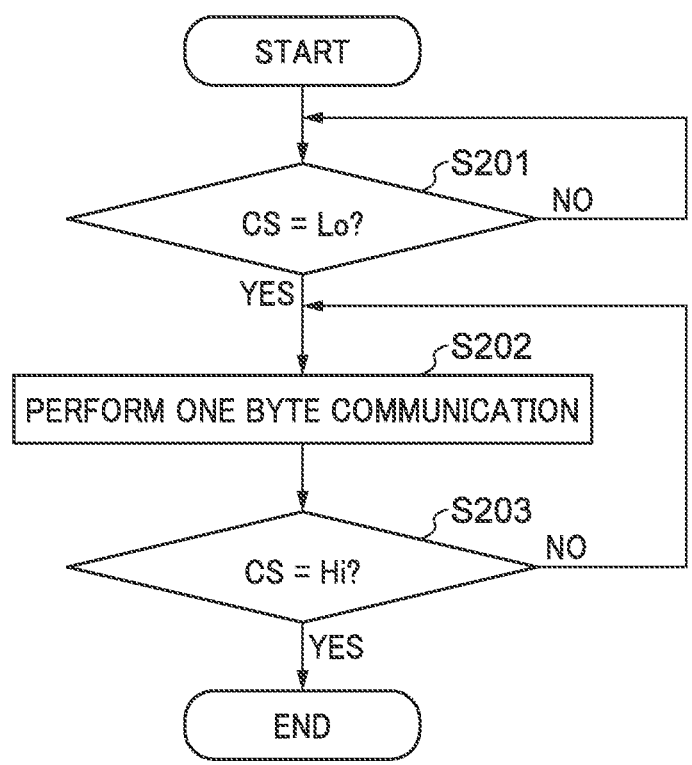

FIG. 3B is a flowchart useful for explaining operations performed by the accessory controller 201 according to the SPI protocol A. In FIG. 3B, each processing operation (step) indicated by S number is realized by a CPU, not shown, of the accessory controller 201 loading a predetermined program stored in a ROM, not shown, of the accessory controller 201 into a RAM, not shown, of the same.

In a step S201, the accessory controller 201 determines whether or not the CS signal has changed to the low level. In a case where the accessory controller 201 determines that the CS signal has not changed to the low level (No to the step S201), the accessory controller 201 repeats determination in the step S201, whereas in a case where the accessory controller 201 determines that the CS signal has changed to the low level (Yes to the step S201), the process proceeds to a step S202. In the step S202, the accessory controller 201 performs input control of the MOSI signal data and output control of the MISO signal data according to input of the SCLK signal to thereby perform communication of one byte of data. In a step S203, the accessory controller 201 determines whether or not the CS signal has changed to the high level. In a case where the accessory controller 201 determines that the CS signal has not changed to the high level (No to the step S203), the process returns to the step S202 for the accessory controller 201 to perform communication of the next one byte of data. On the other hand, in a case where the accessory controller 201 determines that the CS signal has changed to the low level (Yes to the step S203), the accessory controller 201 terminates the present process, thereby terminating SPI communication.

A second communication protocol of the two types of the communication protocol of the SPI communication method is a method in which whether the accessory 200 is in the state capable of communication is checked before the camera 100 outputs the SCLK signal, and is hereafter referred to as "the SPI protocol B".

Figure 2B:
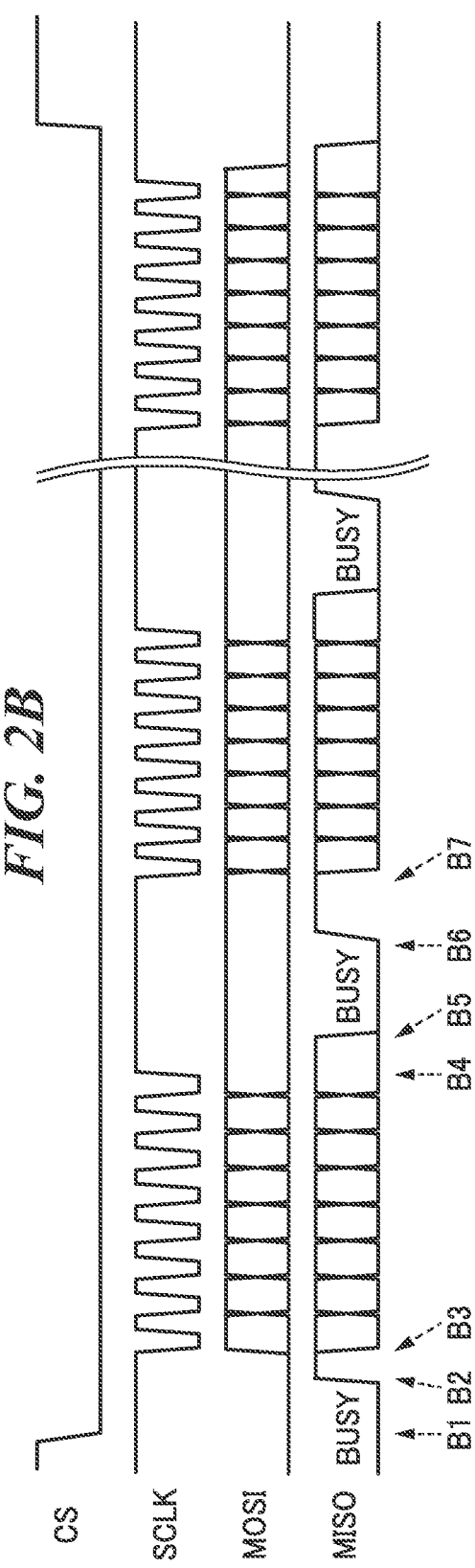

FIG. 2B is a diagram schematically showing waveforms of communication of the SPI protocol B. At a timing B1, the camera controller B 102 changes the CS signal to the low level, thereby requesting the accessory controller 201 to perform SPI communication. In accordance with this request, the camera controller 102 checks the potential of the MISO signal, and if the MISO signal is at the high level, determines that the accessory controller 201 is in a state capable of communication, whereas if the MISO signal is at the low level, determines that the accessory controller 201 is in the state incapable of communication. On the other hand, when the accessory controller 201 detects a falling edge of the CS signal, the accessory controller 201 controls the MISO signal to the high level (timing B2) if the accessory controller 201 is in the state capable of SPI communication, whereas if the accessory controller 201 is in the state incapable of SPI communication, the accessory controller 201 controls the MISO signal to the low level.

Upon confirming that the MISO signal is at the high level at a timing B3, the camera controller B 102 starts outputting the SCLK signal and MOSI signal. Similarly, upon detecting a falling edge of the SCLK signal, the accessory controller 201 starts outputting the MISO signal. Upon completion of outputting the SCLK signal for one byte of data at a timing B4, the camera controller B 102 stops outputting the SCLK signal. After the accessory controller 201 performs transmission and reception of one byte of data, if the accessory controller 201 is in the state capable of SPI communication, the accessory controller 201 controls the MISO signal to the high level, whereas if the accessory controller 201 is in the state incapable of SPI communication, the accessory controller 201 controls the MISO signal to the low level (timings B5 and B6). The camera controller B 102 checks the potential of the MISO signal at a timing B7, and if the MISO signal is at the high level, the camera controller B 102 determines the accessory controller 201 is in the state capable of communication, whereas if the MISO signal is at the low level, the camera controller B 102 determines the accessory controller 201 is in the state incapable of communication.

Figure 4A:
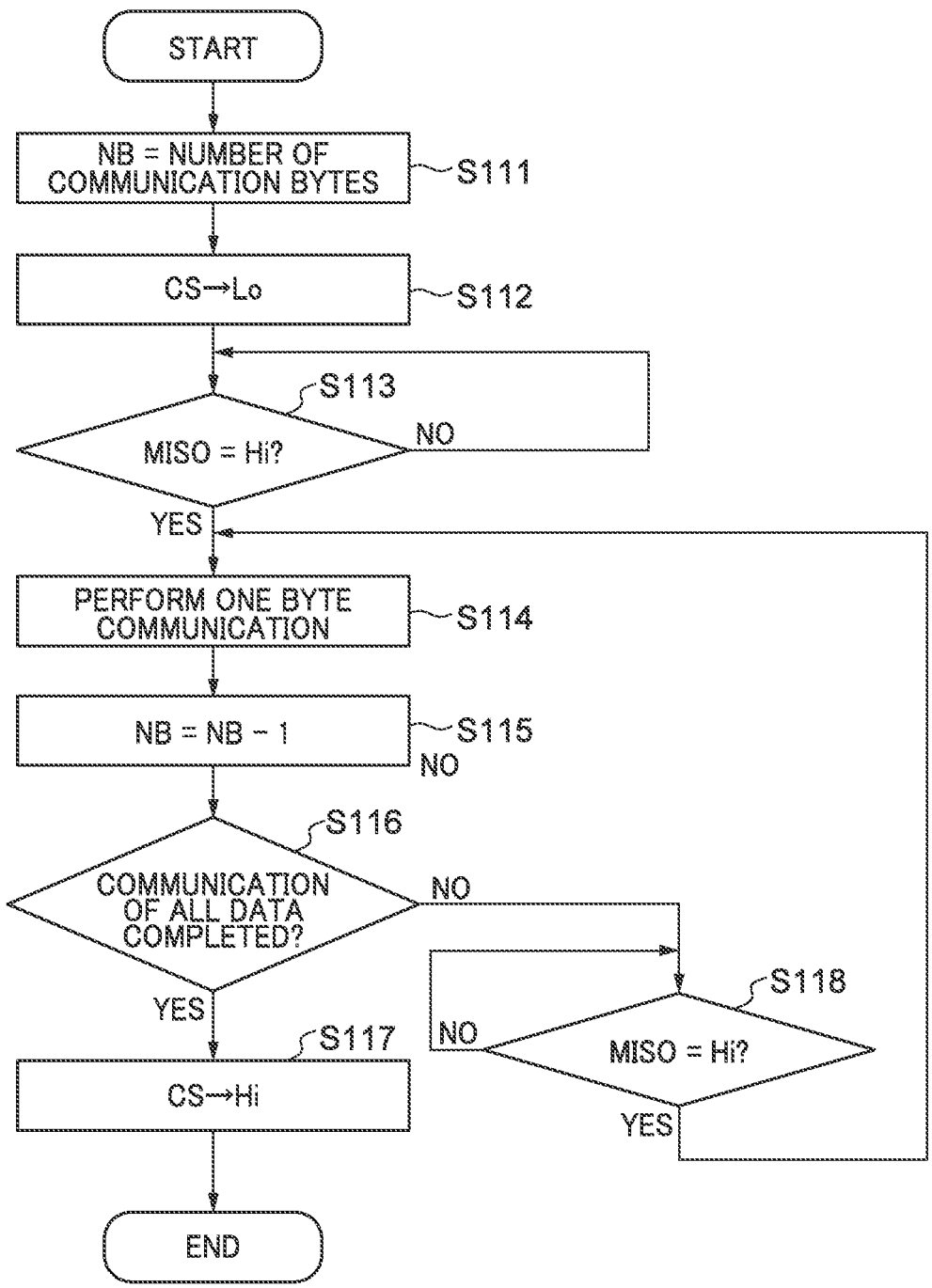
FIGS. 4A and 4B are flowcharts of operations performed by the camera controller and the accessory controller according to a second communication protocol.

FIG. 4A is a flowchart useful in explaining operations performed by the camera controller B 102 according to the SPI protocol B. In FIG. 4A, each processing operation (step) indicated by S number is realized by the CPU of the camera controller B 102 loading a predetermined program stored in the ROM of the camera controller B 102 into the RAM of the same.

In a step S111, the camera controller B 102 stores a value indicative of the number of bytes for transmission as a variable NB. For example, when performing communication of three bytes, the variable NB is set to a value of 3. In a step S112, the camera controller B 102 requests SPI communication by changing the CS signal to the low level. In a step S103, the camera controller B 102 determines whether or not the MISO signal is at the high level. The camera controller B 102 waits (No to the step S113) until the MISO signal goes high, and when the camera controller B 102 determines that the MISO signal is at the high level (Yes to the step S113), the process proceeds to a step S114.

In the step S114, to perform communication of one byte of data, the camera controller B 102 performs SCLK signal output control, and performs output control of MOSI signal data and input control of MISO signal data. In a step S115, the camera controller B 102 decrements the value of the variable NB by one and stores the decremented value as a new value of the NB.

In a step S116, the camera controller B 102 determines whether or not communication of all data is completed (whether the variable NA is equal to 0). Here, when the variable NB is equal to 0, it is determined that communication of all data is completed. If the camera controller B 102 determines that communication of all data is completed (Yes to the step S116), the process proceeds to a step S117, whereas if the camera controller B 102 determines that communication of all data is not completed (No to the step S116), the process proceeds to a step S118.

In the step S117, the camera controller B 102 changes the CS signal to the high level, thereby terminating a series of operations of SPI communication. On the other hand, in the step S118, the camera controller B 102 determines whether or not the MISO signal has changed to the high level. The camera controller B waits (No to the step S118) until the MISO signal goes high, and when the camera controller B 102 determines that the MISO signal is at the high level (Yes to the step S118), the process retunes to the step S114.

Figure 4B:
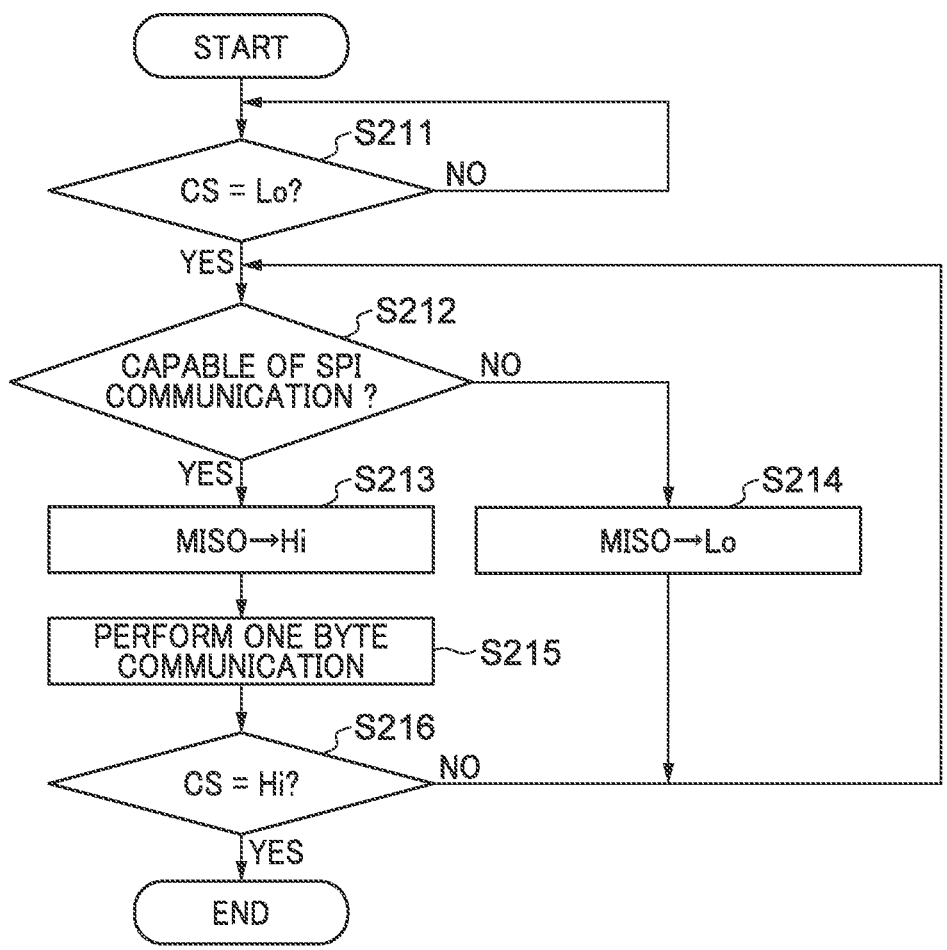

FIG. 4B is a flowchart useful in explaining operations performed by the accessory controller 201 according to the SPI control B. In FIG. 4B, each processing operation (step) indicated by S number is realized by the CPU of the accessory controller 201 loading a predetermined program stored in the ROM of the accessory controller 201 into the RAM of the same.

In a step S211, the accessory controller 201 determines whether the CS signal has changed to the low level. When the accessory controller 201 determines that the CS signal has not changed to the low level (No to the step S211), the accessory controller 201 repeats the determination in the step S211, whereas when the accessory controller 201 determines that the CS signal has changed to the low level (Yes to the step S211), the process proceeds to a step S212. In the step S212, the accessory controller 201 determines whether the accessory controller 201 is in the state capable of SPI communication. When the accessory controller 201 determines that the accessory controller 201 is in the state capable of SPI communication (Yes to the step S212), the process proceeds to a step S213, whereas when the accessory controller 201 determines that the accessory controller 201 is not in the state capable of SPI communication (No to the step S212), the process proceeds to a step S214.

In the step S213, the accessory controller 201 controls the MISO signal to the high level, and then the process proceeds to a step S215. In the step S214, the accessory controller 201 controls the MISO signal to the low level, and then the process returns to the step S212.

In the step 215, the accessory controller 201 performs communication of one byte of data by performing input control of MOSI signal data and output control of MISO signal data according to input of the SCLK signal. In a step S216, the accessory controller 201 determines whether or not the CS signal has changed to the high level. When the accessory controller 201 determines that the CS signal has not changed to the high level (No to the step S216), the process returns to the step S212 to perform communication of the next one byte. On the other hand, when the accessory controller 201 determines that the CS signal has changed to the high level (Yes to the step S216), the accessory controller 201 terminates the present process, whereby SPI communication is terminated.

FIG. 5 is a diagram showing an example of details of communication for notifying an operation execution instruction (command) from the camera 100 to the accessory 200 by SPI communication. In communication of a first one byte, the camera controller B 102 transmits "CMD" which is information indicating a command number as MOSI signal data. In response to this, the accessory controller 201 transmits a value of "0xA5" as MISO signal data. Further, in a case where the accessory controller 201 is incapable of performing communication processing of the first one byte, the accessory controller 201 transmits a value other than "0xA5" as MISO signal data.

In communication of a second byte, the camera controller B 102 transmits an argument of "MOSI_DATA1" which is associated with the command number CMD. In a third byte to a (N−2)-th byte, similarly, the camera controller B 102 transmits arguments of "MOSI_DATA2" to "MOSI_DATA[N−3]" associated with respective the command number CMD. In response to this, in communication of the second byte, the accessory controller 201 transmits the command number CMD received in communication of the first byte, as MISO signal data. This enables the camera controller B 102 to determine that the accessory controller 201 correctly received the MOSI signal data. In communication of the third byte, the accessory controller 201 transmits "MISO_DATA1" which is a return value associated with the command number CMD. In communication of a fourth byte to the (N−2)-th byte, similarly, the accessory controller 201 transmits "MISO_DATA2" to "MISO_DATA[N−4]" which are return values associated with the command number CMD. Note that the arguments and the return values are assumed to be determined in advance for each command number, one or both of each argument and each return value may be omitted.

In communication of a (N−1)-th byte, the camera controller B 102 transmits "CheckSum_C" which is checksum data, as MOSI signal data. CheckSum_C is calculated from data that the camera controller B 102 transmits to the accessory controller 201, by an equation (1) described below. On the other hand, the accessory controller 201 transmits "0x00" indicating an address, as MISO signal data.

In communication of a N-th byte, the camera controller B 102 transmits "0x00" as MOSI signal data. On the other hand, the accessory controller 201 transmits "CheckSum_A" which is checksum data, as MISO signal data.

CheckSum_A is calculated by an equation (2) described below, as second CheckSum_A, or by an equation (3) described below, as third CheckSum_A. More specifically, the accessory controller 201 calculates first CheckSum_C_A by the equation (1) from the data actually received. Then, the accessory controller 201 determines whether or not received CheckSum_C and first CheckSum_C_A match. In a case where the accessory controller 201 determines that CheckSum_C and CheckSum_C_A match, the accessory controller 201 calculates second CheckSum_A by the equation (2) described below and transmits the same to the camera controller B 102. In a case where the accessory controller 201 determines that CheckSum_C and CheckSum_C_A do not match, the accessory controller 201 calculates third CheckSum_A by the equation (3) described below and transmits the same to the camera controller B 102. Note that the CheckSum_A is set to be 1's complement number of second CheckSum_A.

$$CheckSum\_C = EXOR(AND(SUM(CMD, MOSI\_DATA1, \ldots, MOSI\_DATA[N-3]), 0xFF), 0xFF) \quad (1)$$

$$CheckSum\_A = EXOR(AND(SUM(0xA5, CMD, MISO\_DATA1, \ldots, MISO\_DATA[N-4]), 0xFF), 0xFF) \quad (2)$$

$$CheckSum\_A = AND(SUM(0xA5, CMD, MISO\_DATA1, MISO\_DATA[N-4]), 0xFF) \quad (3)$$

Referring again to FIG. 1, the electrical configuration of the camera 100 continues to be described. A communication request signal/WAKE for requesting, from the accessory 200, the camera controller A 101 to perform communication is connected to a contact TC11. The communication request signal/WAKE is pulled up via a resistor to the camera microcomputer power supply VMCU_C. The camera controller A 101 receives the communication request from the accessory 200 by detecting a falling edge of the communication request signal/WAKE.

The SDA signal connected to a contact TC12 and the SCL signal connected to a contact T13 are signals for the camera controller A 101 to perform I2C communication which is a type of serial communication, as the communication master. The communication using the SDA signal and the SCL signal is open-drain communication which is pulled up to the camera microcomputer power supply VMCU_C, and in the present embodiment, the communication frequency is assumed to be 100 kbps.

In I2C communication, both of data transmission from the camera 100 and data transmission from the accessory 200 are performed by the SDA signal. I2C communication is lower in communication speed than SPI communication. Further, since SPI communication is higher in communication speed than I2C communication, SPI communication is suitable for communication of information having a large amount of data. Therefore, in communication between the camera 100 and the accessory 200 in the present embodiment, information having a large amount of data is communicated using SPI communication, whereas information having a small amount of data is communicated using I2C communication. For example, first, data is communicated using I2C communication, and in a case where it is determined, based on the communication of the data, that SPI communication can be executed or in a case where it is necessary to perform SPI communication, it is possible to control to perform SPI communication thereafter.

Figure 22A:
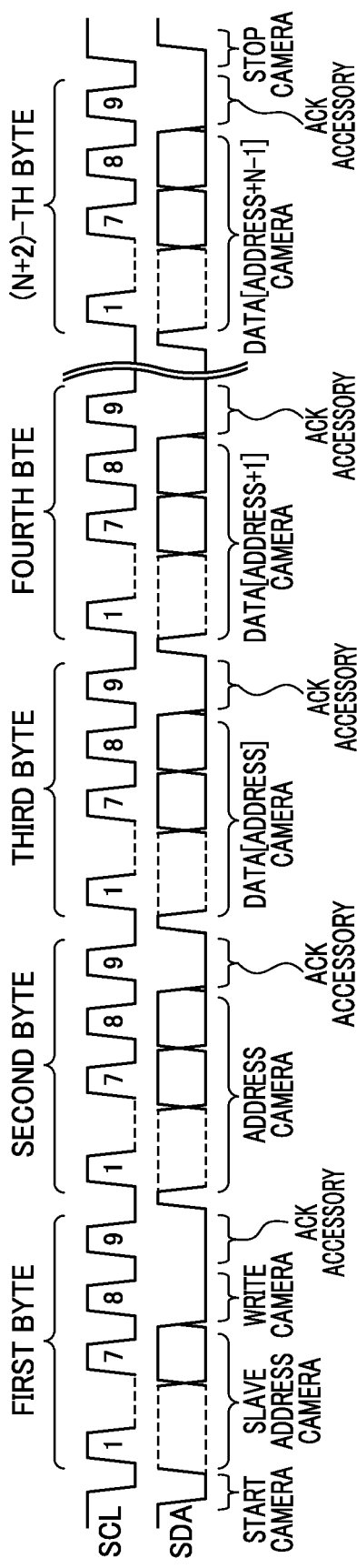
FIGS. 22A and 22B are diagrams showing examples of waveforms of I2C communication.
Figure 22B:
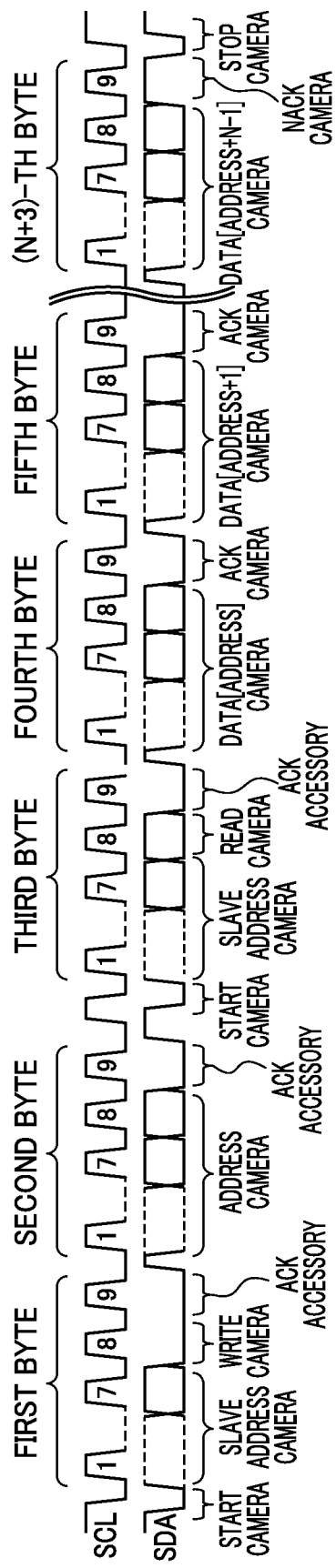

FIGS. 22A and 22B are diagrams showing examples of waveforms of I2C communication. FIG. 22A shows examples of waveforms of communication in a case where the camera 100 transmits N bytes of data (DATA[1] to DATA[N]) to the accessory 200, whereas FIG. 20B shows examples of waveforms of communication in a case where the camera 100 receives N bytes of data (DATA[1] to DATA[N]) from the accessory 200.

In FIGS. 22A and 22B, a waveform in each upper row is a waveform of the SCL signal, and a waveform in each lower row is a waveform of the SDA signal. Under the waveform of the SDA signal, there are described what is meant by each associated portion of the SDA signal and which of the camera controller A 101 and the accessory controller 201 controls the output level of the SDA signal. Further, communication data is composed of data in a unit of one byte and information of one bit indicating a response, and hence, to make the explanation easier to understand, there are indicated, above the illustration of the waveforms, how manieth byte from the start of communication each portion of data corresponds to. Details of contents of communication will be described with reference to FIGS. 23 to 25, and hence, description of the same with reference to FIGS. 22A and 22B is omitted.

Referring to FIG. 22A, in the communication of the first byte and the second byte, the camera controller A 101 notifies storage address information of data to be received to the accessory controller 201. In the communication of the third byte to the (N+2)-th byte, the camera controller A 101 transmits N bytes of data (DATA[ADDRESS] to DATA[ADDRESS+N−1] to the accessory controller 201.

Referring to FIG. 20B, in the communication of the first byte and the second byte, the camera controller A 101 notifies storage address information of data to be received to the accessory controller 201. In the communication of the fourth byte to the (N+3)-th byte, the camera controller A 101 receives N+1 bytes of data (DATA[ADDRESS] to DATA[ADDRESS+N−1] from the accessory controller 201.

Figure 23:
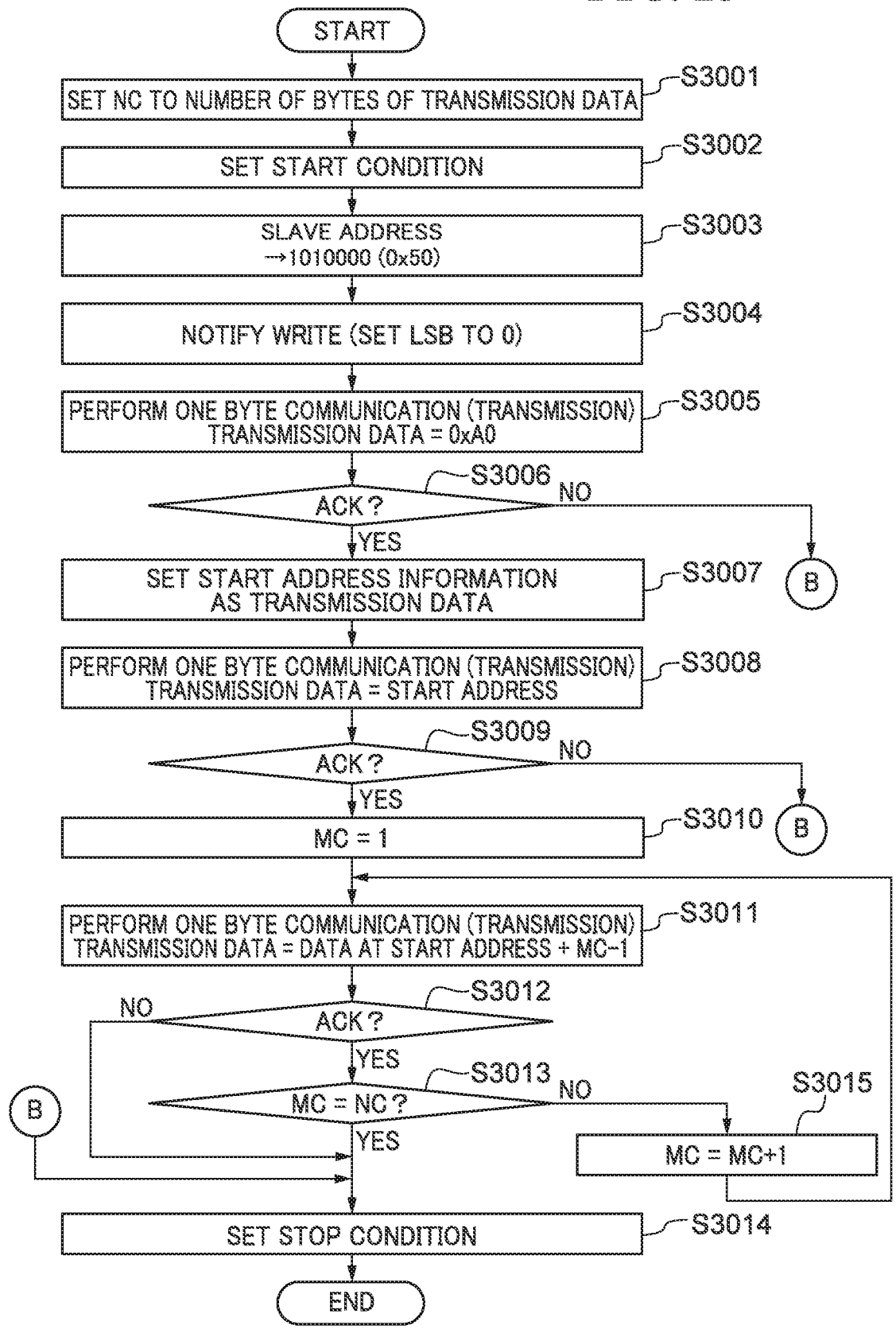
FIG. 23 is a diagram showing a process performed by the camera controller when the camera controller transmits NC bytes of data to the accessory controller.

Now, processes will be described with reference to FIGS. 23 to 25. FIG. 23 is a diagram showing a process performed by the camera controller A 101 when the camera controller A 101 transmits NC bytes of data to the accessory controller 201. In FIG. 23, each processing operation (step) indicated by S number is realized by the CPU of the camera controller A 101 loading a program stored in a ROM, not shown, of the camera controller A 101 into a RAM, not shown, of the same, and executing the program.

In a step S3001, the camera controller A 101 stores a value indicative of the number of bytes for transmission as a variable NC. For example, in a case where three bytes of data are to be transmitted, the variable NC is set to a value of 3. In a step S3002, while the SCL signal is at the high level, the camera controller A 101 changes the SDA signal to the low level (start condition). This notifies the accessory controller 201 of the start of communication.

In a step S3003, the camera controller A 101 sets slave address information indicating a slave address of the accessory controller 201 in the most significant seven bits of transmission data. In the present embodiment, the slave address of the accessory controller 201 is 1010000 in binary number.

In a step S3004, the camera controller A 101 sets information indicating WRITE communication in the least significant one bit of the transmission data. The least significant one bit set to a value of 0 means WRITE communication.

In a step S3005, the camera controller A 101 transmits data (10100000 in binary number, i.e. 0xA0 in sexadecimal number) set as the transmission data in the steps S3003 and S3004 to the accessory controller 201.

After transmitting the one byte of data, in a step S3006, the camera controller A 101 outputs one clock of the SCL signal and checks the signal level of the SDA signal. The camera controller A 101 determines, in a case where the signal level of the SDA signal is low, that the accessory controller 201 has performed data reception notification (ACK) (Yes to the step S3006), and the process proceeds to a step S3007. On the other hand, in a case where the signal level of the SDA signal is high, the camera controller A 101 determines that the accessory controller 201 has not normally received the transmission data (No to the step S3006), and the process proceeds to a step S3014.

In the step s3007, the camera controller A 101 sets storage address information (start address information) of data to be transmitted to the accessory controller 201, as transmission data. In the present embodiment, it is assumed that the size of data of the start address information is one byte, and a value thereof is 0x00.

In a step S3008, the camera controller A 101 transmits the one byte of the set start address information (value of 0x00) to the accessory controller 201. After transmitting the one byte of data of the start address information, in a step S3009, the camera controller A 101 outputs one clock of the SCL signal and checks the signal level of the SDA signal. The camera controller A 101 determines, in a case where the signal level of the SDA signal is low, that the accessory controller 201 has performed data reception notification (ACK) (Yes to the step S3009), and the process proceeds to a step S3010. On the other hand, in a case where the signal level of the SDA signal is high, the camera controller A 101 determines that the accessory controller 201 has not normally received the transmission data (No to the step S3009), and the process proceeds to the step S3014.

In the step S3010, the camera controller A 101 sets a variable MC to a value of 1. The variable MC is for counting the number of transmitted data items. In a step S3011, the camera controller A 101 transmits one byte of data to the accessory controller 201, by outputting the SCL signal for the one byte of data and changing the SDA signal to a desired level while the signal level of the SCL signal is low. Here, since the start address information is 0 x00 and the variable MC is 1, one byte of data associated with an address of 0x00 is transmitted.

After transmitting the one byte of data, in a step S3012, the camera controller A 101 outputs one clock of the SCL signal and checks the signal level of the SDA signal. The camera controller A 101 determines, in a case where the signal level of the SDA signal is low, that the accessory controller 201 has performed data reception notification (ACK) (Yes to the step S3012), and the process proceeds to a step S3013. On the other hand, in a case where the signal level of the SDA signal is high, the camera controller A 101 determines that the accessory controller 201 has not normally received the transmission data (No to the step S3012), and the process proceeds to the step S3014.

In the step S3013, the camera controller A 103 checks whether or not the value of the variable MC is equal to that of the variable NC. The camera controller A 101 determines, in a case where the value of the variable MC is equal to that of the variable NC (YES to the step S3013), that transmission of all data is completed, and the process proceeds to the step S3014. On the other hand, in a case where the value of the variable MC is not equal to that of the variable NC (No to the step S3013), the camera controller A 101 determines that there remains data to be transmitted, and the process proceeds to a step S3015.

In the step S3015, the camera controller A 101 adds 1 to the variable MC, and then the process returns to the step S3011. Whenever the process thus returns to the step S3011, the camera controller A 101 sequentially increments the address of data to be transmitted and transmits one byte of data associated with the address.

By thus repeatedly transmitting one byte of data until it is determined in the step S3013 that the variable MC is equal to the variable NC, the camera controller A 101 transmits NC bytes of data to the accessory controller 201. In the present embodiment, in a case where the variable NC is set to 3, it is possible to three bytes of data.

In the step S3014, the camera controller S3014 changes the SDA signal to the high level (stop condition) while the SCL signal is at the low level. This notifies the accessory controller 201 of termination of the communication.

Figure 24:
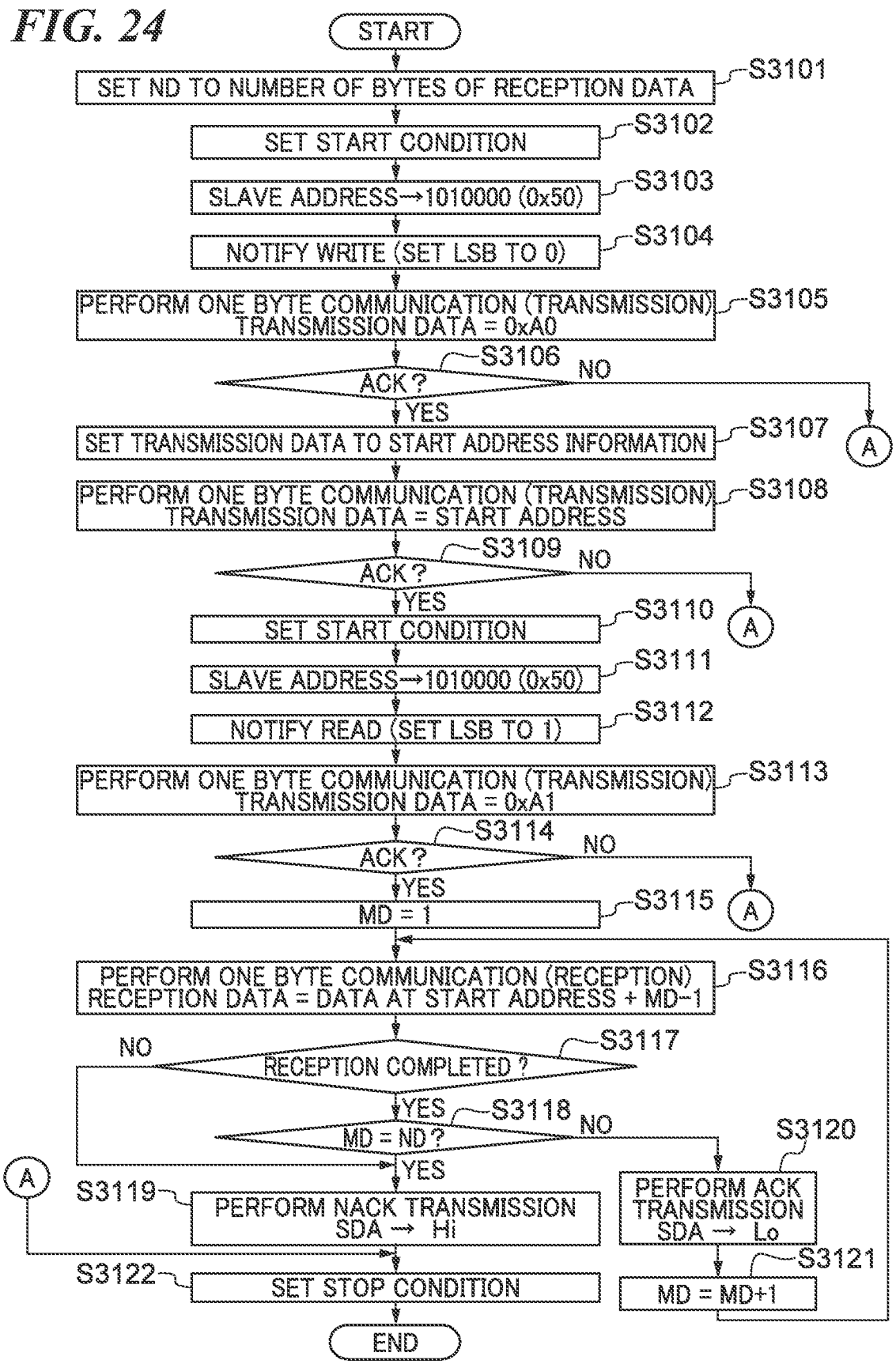
FIG. 24 is a diagram showing a process performed by the camera controller when the camera controller receives ND bytes of data from the accessory controller.

FIG. 24 is a process performed by the camera controller A 101 when the camera controller A 101 receives ND bytes of data from the accessory controller 201. In FIG. 24, each processing operation (step) indicated by S number is realized by the CPU of the camera controller A 101 loading a predetermined program stored in the ROM of the camera controller A101 into the RAM of the same and executing the program.

In a step S3101, the camera controller A 101 sets the variable ND to a value indicative of the number of bytes of data to be received. For example, in a case where three bytes of data are to be received, the variable ND is set to a value of 3. In the present embodiment, it is assumed that the variable ND is set to a value of 3. In a step S3102 to a step S3106, the camera controller A 101 executes the same processing operations as executed in the steps S3002 to S3006 in FIG. 23, respectively.

In a step S3107, the camera controller A 101 sets storage address information (start address information) of data to be received from the accessory controller 201 as transmission data. In the present embodiment, the size of the start address information is one byte and its value is equal to 0x00. In a step S3108, the camera controller A 101 transmits one byte of data of the set start address information (value of 0x00) to the accessory controller 201.

In a step S3109, the camera controller A 101 outputs one clock of the SCL signal and checks the signal level of the SDA signal. In a case where the signal level of the SDA signal is low, the camera controller A 101 determines that that the accessory controller 201 has performed data reception notification (ACK) (Yes to the step S3109), and the process proceeds to a step S3110. On the other hand, in a case where the signal level of the SDA signal is high, the camera controller A 101 determines that that the accessory controller 201 has not normally received the data (No to the step S3109), and the process proceeds to a step S3122.

In the step S3110, similar to the step S3102, the camera controller A 101 changes the SDA signal to the low level while the SCL signal is at the high level, thereby notifying the accessory controller 201 of the start condition. In a step S3111, the camera controller A 101 sets slave address information indicating a slave address of the accessory controller 201 in the most significant seven bits of transmission data. In the present embodiment, it is assumed that the slave address of the accessory controller 201 is 1010000 in binary number.

In a step S3112, the camera controller A 101 sets information indicating READ communication in the least significant one bit of the transmission data. The least significant one bit set to a value of 1 means READ communication.

In a step S3113, the camera controller A 101 transmits data (10100001 in binary number, i.e. 0xA1 in sexadecimal number) set as the transmission data in the steps S3111 and S3112 to the accessory controller 201.

After transmitting the one byte of data, in a step S3114, the camera controller A 101 outputs one clock of the SCL signal and checks the signal level of the SDA signal. The camera controller A 101 determines, in a case where the signal level of the SDA signal is low, that the accessory controller 201 has performed data reception notification (ACK) (Yes to the step S3114), and the process proceeds to a step S3115. On the other hand, in a case where the signal level of the SDA signal is high, the camera controller A 101 determines that the accessory controller 201 has not normally received the transmission data (No to the step S3114), and the process proceeds to the step S3122.

In the step 3115, the camera controller A 101 sets a variable MD to 1. The variable MD is for counting the number of received data items. In a step S3116, the camera controller A 101 outputs the SCL signal for one byte of data, and reads a signal level of the SDA signal at each timing of change of the SCL signal from the low level to the high level. This makes it possible to receive the one byte of data from the accessory controller 201. The received one byte of data can be stored in the nonvolatile memory 125 or used for a predetermined process, as data associated with the address of 0x00.

In a step S3117, the camera controller A 101 determines whether or not the one byte of data could be normally received. In a case where the camera controller A 101 determines that the byte of data could be normally received (Yes to the step S3117), the process proceeds to a step S3118. On the other hand, in a case where the camera controller A 101 determines that the one byte of data could not be normally received (No to the step S3117), the process proceeds to a step S3119.

In the step S3118, the camera controller A 101 checks whether or not the value of the variable MD is equal to that of the variable ND. The camera controller A 101 determines, in a case where the value of the variable MD is equal to that of the variable ND (Yes to the step S3118), that transmission of all data is completed, and the process proceeds to the step S3118. On the other hand, in a case where the value of the variable MD is not equal to that of the variable ND (No to the step S3118), the camera controller A 101 determines that there remains data to be transmitted, and the process proceeds to a step S3120.

In the step S3120, the camera controller A 101 outputs the SCL signal for one byte of data and then controls the SDA signal to the low level to thereby perform data reception notification (ACK) to the accessory controller 201 so as to notify that data communication is to be continued. In a step S3121, the camera controller A 101 adds 1 to the variable MD, and then the process returns to the step S3116. After thus returning to the step S3116, the camera controller A 101 sequentially increments the address of data to be received and receives one byte of data associated with each incremented address.

By thus repeatedly receiving one byte of data until it is determined in the step S3118 that the value of the variable MD is equal to that of the variable ND, the camera controller A 101 receives ND bytes of data from the accessory controller 201. In a case where the variable ND is set to 3 as in the present embodiment, it is possible to receive three bytes of data.

In the step S3119, the camera controller A 101 outputs the SCL signal for one byte of data and controls the SDA signal to the high level to thereby notify the accessory controller 201 of completion of data communication (NACK). In the step S3122, the camera controller A 101 changes the SDA signal to the high level while the SCL signal is at the high level (stop condition). This notifies the accessory controller 201 of termination of communication.

Figure 25:
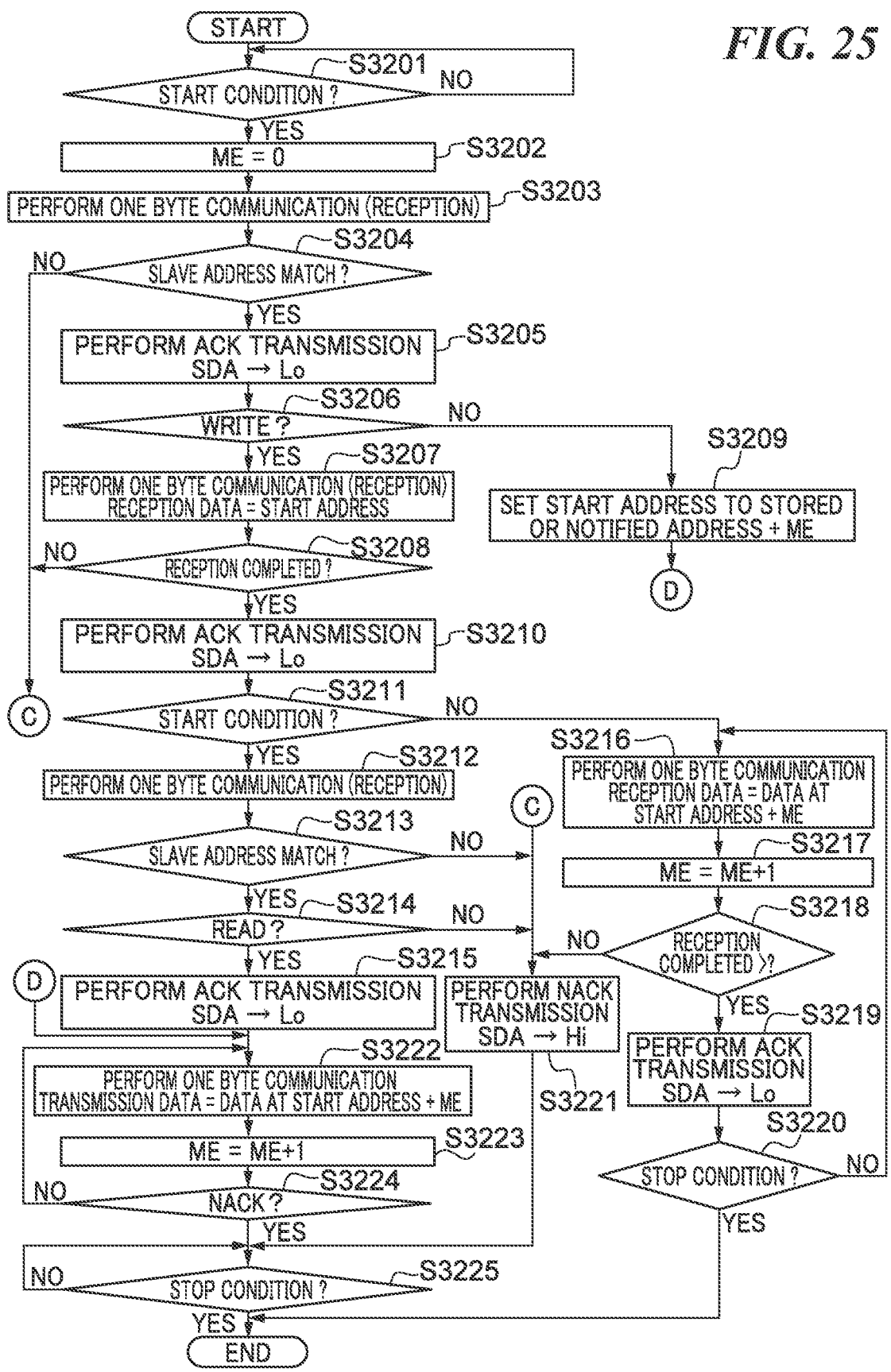
FIG. 25 is diagram showing a process performed by the accessory controller when the camera controller and the accessory controller transmit and receive NE bytes of data.

FIG. 25 is a flowchart of a process performed by the accessory controller 201 when NE bytes of data are transmitted and received between the camera controller A 101 and the accessory controller 201. Note that this process includes a process performed by the accessory controller 201 for receiving NE bytes of data from the camera controller A 101, and a process performed by the accessory controller 201 for transmitting NE bytes of data to the camera controller A 101. In FIG. 23, each processing operation (step) indicated by S number is realized by the CPU of the accessory controller 201 loading a predetermined program stored in the ROM of the accessory controller 201 into the RAM of the same.

In a step S3201, the accessory controller 201 waits (No to the S3201) until the SDA signal goes low (the start condition is detected) while the SCL signal is at the high level. When the accessory controller 201 detects the start condition (Yes to the S3201), the process proceeds to a step S3202.

In the step S3202, the accessory controller 201 sets a variable ME to 0. The variable ME is for counting the number of transmitted data items or the number of received data items. In a step S3203, the accessory controller 201 receives one byte of data transmitted from the camera controller A 101.

In a step S3204, the accessory controller 201 determines whether data of the most significant seven bits of the received one byte of data matches the salve address (0x50 in the present embodiment) of the accessory controller 201. In a case where the accessory controller 201 determines that the data matches the slave address (Yes to the step S3204), the process proceeds to a step S3205, whereas in a case where the accessory controller 201 determines that the data does not match the slave address (No to the step S3204), the process proceeds to a step S3221.

In the step S3205, the accessory controller 201 performs data reception notification (ACK) to the camera controller A 101, by controlling the SDA signal to the low level in response to the next output of one clock of the SCL signal. In a step S3206, the accessory controller 201 determines a type of data of one-byte communication to be performed next, based on data of the least significant one bit of the one byte of data received in the step S3203. In a case where the data of the least significant one bit is 0, the accessory controller 201 determines that data of the one-byte communication to be performed next is start address information to be written into the accessory controller 201 from the camera controller A 101 (Yes to the step S3206), and the process proceeds to a step S3206. On the other hand, in a case where the data of the least significant one bit is 1, the accessory controller 201 determines that data of the one-byte communication to be performed next is transmission data from the accessory controller 201 to the camera controller A 101 (No to the step S3206), and the process proceeds to a step S3209.

In a step S3207, the accessory controller 201 receives one byte of data transmitted from the camera controller A 101. The received one byte of data is information on an address of data where data to be transmitted and received by the following communication is stored. In the present embodiment, as described with reference to FIGS. 21A, 21B, 22A and 22B, it is assumed that the start address information is 0x00.

In the step S3209, the accessory controller 201 sets the start address information to address information stored in the accessory controller 201 in advance or address information notified from the camera controller A 101 in advance.

In the step S3208, the accessory controller 201 determines whether or not the one byte of data has been correctly received. In a case where the accessory controller 201 determines that the one byte of data has been correctly received (Yes to the step S3208), the process proceeds to a step S3210, whereas the accessory controller 201 determines that the one byte of data has not been correctly received (No to the step S3208), the process proceeds to the step S3221.

In the step S3210, the accessory controller 201 performs data reception notification (ACK) to the camera controller A 101, by controlling the SDA signal to the low level in response to the next output of one clock of the SCL signal after reception of the one byte of data.

In a step S3211, the accessory controller 201 determines whether or not the SDA signal goes low while the SCL signal is at the high level (the start condition is detected). In a case where the accessory controller 201 has detected the start condition, one byte of data to be communicated next is data to be transmitted to the accessory controller 201 from the camera controller A 101, which indicates a slave address and a type of communication. On the other hand, in a case where the accessory controller 201 has not detected the start condition, one byte of data to be communicated next is data information to be received by the accessory controller 201 from the camera controller A 101. In the case where the accessory controller 201 determines that it has detected the start condition (Yes to the step S3211), the process proceeds to a step S3212, whereas in the case where the accessory controller 201 determines that it has not detected the start condition (No to the step S3211), the process proceeds to a step S3216.

In the step S3212, the accessory controller 201 receives one byte of data transmitted from the camera controller A 101. In a step S3213, the accessory controller 201 determines whether or not the data of the most significant seven bits of the one byte of data received in the step s3212 matches a slave address of the accessory controller 201 (0x50 in the present embodiment). In a case where the accessory controller 201 determines that the data of the most significant seven bits of the data matches the slave address of the accessory controller 201 (Yes to the step S3213), the process proceeds to a step S3214. The accessory controller 201 determines that the data of the most significant seven bits of the data does not match the slave address of the accessory controller 201 (No to the step S3213), the process proceeds to the step S3221.

In the step S3214, the accessory controller 201 determines a type of data of one-byte communication to be performed next, based on the data of the least significant one bit of the one byte of data received in the step S3212. In a case where the data of the least significant one bit is 1, the accessory controller 201 determines that data of one byte communication to be performed next is transmission data to be read from the accessory controller 201 into the camera controller A 101 (Yes to the step S3214), and the process proceeds to a step S3215. On the other hand, in a case where the accessory controller 201 determines that the data of the least significant one bit is 0, (No to the step S3214), and the process proceeds to the step S3221.

In the step S3215, the accessory controller 201 performs data reception notification (ACK) to the camera controller A 101, by controlling the SDA signal to the low level in response to the next output of one clock of the SCL signal after reception of the one byte of data.

In the step S3221, the accessory controller 201 notifies the camera controller A 101 of completion of data communication (NACK) by controlling the SDA signal to the high level, and then the process proceeds to the step S3225. In the step S3222, the accessory controller 201 transmits one byte of data associated with the start address information received from the camera controller A 101 in the step S3207 or the start address information set in the step S3209, to the camera controller A 101.

In a step S3223, the accessory controller 201 adds 1 to the variable ME. In the following step S3224, the accessory controller 201 checks the signal level of the SDA signal after transmission of the one byte of data. In a case where the signal level of the SDA signal is high, the accessory controller 201 determines that it means notification (NACK) that the camera controller A 101 has completed reception of all data (Yes to the step S3224), the process proceeds to the step S3225. On the other hand, in a case where the signal level of the SDA signal is low, the accessory controller 201 determines that the camera controller A 101 continues to demand transmission of data from the accessory controller 201 (No to the step S3224), the process returns to the step S3222.

After the process thus returns to the step S3222, the accessory controller 201 sequentially increments the address of data to be transmitted, and transmits one byte of data associated with the incremented address. Thus repeating transmission of one byte of data until the NACK is notified from the camera controller A 101 in the step S3224, the accessory controller 201 transmits NE bytes of data to the camera controller A 101.

In the step S3225, the accessory controller 201 determines whether or not the SDA signal has changed to the high level while the SCL signal is at the high level (stop condition). The accessory controller 201 repeats the determination (No to the step S3225) until the stop condition is detected, and when it is determined that the stop condition is detected (Yes to the step S3225), the present process is terminated.

Now, in the step S3216 to which the process proceeds when the answer to the question of the step S3211 negative (No), the accessory controller 201 receives one byte of data. This one byte of data is stored in the nonvolatile memory, not shown, or the like and is used for a predetermined process, as data associated with the start address information received from the camera controller A 101.

In a step S3216, the accessory controller 201 adds 1 to the variable ME. In the following step S3218, the accessory controller 201 determines whether or not one byte of data could be normally received. In a case where the accessory controller 201 determines that the one byte of data could be normally received (Yes to the step S3218), the process proceeds to a step S3219, whereas in a case where controller 201 determines that the one byte of data could not be normally received (No to the step S3218), the process proceeds to the step S3221.

In the step S3219, the accessory controller 201 performs data reception notification (ACK) to the camera controller A 101, by controlling the SDA signal to the low level in response to the next output of one clock of the SCL signal after reception of one byte of data. In a step S3220, the accessory controller 201 determines whether or not the SDA signal has changed to the high level while the SCL signal is at the high level (stop condition). In a case where the accessory controller 201 determines that the stop condition is detected (Yes to the step S3220), the present process is terminated. On the other hand, in a case where the stop condition is not been detected (No to the step S3220), the accessory controller 201 determines that data transmission from the camera controller A 101 to the accessory controller 201 is to be continued, and hence the process returns to the step S3216.

After the process thus returns to the step S3216, the accessory controller 201 sequentially increments the address of data to be received, and receives one byte of data associated with the incremented address. The accessory controller 201 repeats reception of one byte of data until the stop condition is notified in the step S3220, whereby the accessory controller 201 receives NE bytes of data from the camera controller A 101.

An FNC1 signal, an FNC2 signal, an FNC3 signal, and an FNC4 signal connected to a contact TC14, a contact TC15, a contact TC16, and a contact TC17, respectively, are signals (function signals) capable of changing the functions thereof according to the type of the accessory 200. For example, in a case where the accessory 200 is a microphone device, the function signal communicated via the TC15 is an audio data signal. In a case where the accessory 200 is a lighting device (strobe device), the function signal communicated via the TC14 is a signal notifying light emission timing.

Note that depending on the type of an accessory mounted on the camera 100, one of signals realizing respective different functions may be communicated via the same contact. For example, in a case where the accessory 200 is other than the lighting device, a synchronization signal for controlling timing other than the light emission timing may be communicated via the TC 14. The contacts TC14 to TC17 are referred to as the function signal contacts. Communication using at least one of the function signal contacts is referred to as the function signal communication.

The function signal communication can be executed in parallel with I2C communication or SPI communication, at a timing not dependent on I2C communication or SPI communication.

The types of accessories mentioned here are the microphone device, the lighting device, and the like. As in the case of lighting devices different in performance, accessories realizing the functions of the same purpose are categorized into the same type of accessories. As in the case of microphone devices and lighting devices, accessories realizing the respective functions of different purposes are categorized into different types of accessories.

The function signal communication is executed based on information acquired by I2C communication or SPI communication.

A contact TC18 as a second ground contact is connected to ground, and similar to the contact TC04 as the first ground contact, the contact TC18 serves as the reference potential of the camera 100 and the accessory 200. A contact TC19 as a differential signal contact and a contact TC20 as a differential signal contact are connected to the camera controller B 102. A differential signal D2N is connected to the contact TC19 and a differential signal D2P is connected to the contact TC20. It is possible to perform, e.g. USB communication via the TC19 and the TC20. The differential signal D2N and the differential signal D2P are differential data communication signals that perform data communication as a pair.

A contact TC21 as a fourth ground contact is connected to ground, and serves not only as a contact of the reference potential but also as a contact for controlling the wiring impedance of the differential signal D2N and the differential signal D2P.

The contacts TC01, TC04, TC06, TC18, and TC21 are connected to e.g. a ground portion of a flexible circuit board, not shown, of the camera 100. The ground portion of the flexible circuit board is fixed to a metallic member of which the potential is at ground level of the camera 100, with screws or the like. The metallic member of which the potential is at ground level is an engagement member provided in an accessory shoe, not shown, of the camera 100, for engagement with the accessory 200, or a base plate, not shown, inside the camera 100.

In the present embodiment, the mounting detection contact TC06 to which the accessory mounting detection signal/ACC_DE is connected is disposed adjacent to the contact TC07 (first clock contact) that conveys the SCLK signal which is the clock signal (first clock signal). In general, noise caused by potential variation of the clock signal (clock noise) is transmitted to contacts adjacent to the contact of the clock signal, which can cause malfunction. Especially, in the case of the configuration of the present embodiment in which there are a large number of contacts and the distances between the contacts are short, the noise has greater influence. In view of this, the mounting detection contact TC06 is disposed adjacent to the contact TC07 for the SCLK signal, thereby reducing influence of the clock noise.

The accessory mounting detection signal/ACC_DET is pulled up before mounting the accessory, but is set to ground level after mounting of the accessory. On the other hand, the contact TC07 that conveys the SCLK signal which is the clock signal does not convey the clock signal before mounting the accessory, and hence there is no variation in the potential, but only after mounting the accessory, it conveys the clock signal, causing variation in the potential. When the contact for SCLK signal conveys the clock signal, the mounting detection contact TC06 is at ground potential. Therefore, even when the mounting detection contact TC06 receives clock noise, the potentials of the control circuits of the camera 100 and the accessory 200 are hard to vary, and hence it is possible to prevent malfunction. Further, it is possible to suppress clock noise from being transmitted to more remote locations than the mounting detection contact TC06. As a result, it is not required to dispose a ground terminal, so that it is possible to suppress influence of clock noise without increasing the number of contacts.

The SCL signal (second clock signal) as the clock signal is also transmitted to a contact (second clock contact) TC13 as a SCL signal contact. However, the SCLK signal transmitted to the SCLK signal contact TC07 is higher in frequency than the SCL signal, and more clock noise is generated from the SCLK signal contact TC07 than from the SCL signal contact TC13. For this reason, to dispose the mounting detection contact TC06 adjacent to the SCLK signal contact TC07 is more effective in the prevention of malfunction caused by clock noise than to dispose the same adjacent to the SCL signal contact TC13.

Further, the difference of the SCL signal from the SCLK signal is not the frequency alone. The SCL signal transmitted via the SCL signal contact TC13 is a clock signal based on the I2C communication standard, and a change in the voltage of the signal line is driven by open-drain connection. On the other hand, the SCLK signal transmitted via the SCLK signal contact TC07 is a clock signal based on the SPI communication standard, and a change in the voltage of the signal line is driven by CMOS output. For this reason, the SCL signal contact TC13 tends to be gentler in a changing edge of voltage than the SCLK signal contact TC07, which makes clock noise difficult to be generated. Therefore, to dispose the mounting detection contact TC06 adjacent to the SCLK signal contact TC07 is more effective in the prevention of malfunction caused by clock noise than to dispose the same adjacent to the SCL signal contact TC13.

Further, there is a case where the differential signals DIN and D1P are transmitted as a pair to the differential signal contacts TC19 and TC20 as well, to thereby transmit a clock signal. At this time, there is a case where the differential signal contacts TC19 and TC20 convey a clock signal (third clock signal) higher in frequency than the SCLK signal contact TC03 and the SCL signal contact TC13 do. However, since the differential signals DIN and D1P are paired signals, and hence emit a smaller amount of clock noise than the SCLK signal contact TC07 and the SCL signal contact TC13 that convey single end signals. For this reason, to dispose the mounting detection signal TC06 adjacent to the SCLK signal contact TC07 is more effective in the prevention of malfunction caused by clock noise than to dispose the same adjacent to the first and second differential signal contact TC19 and TC20.

Note that the contact (first data contact) TC08 disposed on a side of the SCLK signal contact TC07 opposite to the mounting detection signal TC06 transmits the MOSI signal (first data signal). Since the MOSI signal is a data signal, it appears susceptible to clock noise. However, since the MOSI signal is a data signal based on the same SPI communication standard on which the clock signal transmitted via the SCLK signal contact TC07 is based, a change timing of potential is synchronous to the clock signal, and hence the MOSI signal is hard to be affected by clock noise. Therefore, the contact TC08 is not required to be fixed to ground potential, but can be used as the MOSI signal contact.

Next, the electrical configuration of the accessory 200 appearing in FIG. 1 will be described. The accessory 200 is comprised of the accessory controller 201, an accessory power supply unit 202, a power switch 203, a charge section 204, a battery 205, a function section 206, a differential communication section 207, an external communication interface section 208, an external connection terminal 209, and a connection detection section 210. Further, the accessory 200 includes the accessory connection section 211 and operation switches 212.

The accessory controller 201 is a circuit (control unit) that controls the overall operation of the accessory 200, and is implemented by a microcomputer incorporating the aforementioned CPU and the like. The battery 205 supplies electrical power to components of the accessory 200. Note that the accessory 200 is also supplied with electrical power from the camera 100 via the camera connection section 141 and the accessory connection section 211.

The accessory power supply unit 202 is comprised of a DC-DC converter circuit, an LDO circuit, a charge pump circuit, and so forth, and generates power to be supplied to the components of the accessory 200. The accessory controller 201 is always supplied with a voltage of 1.8V as an accessory microcomputer power supply VMCU_A, which is generated by the accessory power supply unit 201. Note that the voltage generated by the accessory power supply unit 202 may be configured to be different from 1.8V. The accessory controller 201 controls the accessory power supply unit 202 to thereby perform on/off control of power supply to the components of the accessory 200.

The charge section 204 charges the battery 205 using power supplied from the camera 100. In a case where it is determined that sufficient power for charging the battery 205 is supplied from the camera 100, the accessory controller 201 controls the charge section to charge the battery 205. Note that in the present embodiment, the description is given of an example of a configuration of the accessory 200 in which the battery 205 can be mounted, but the accessory 200 may be configured to operate using power supplied only from the camera 100 without having the battery 205 mounted thereon, and in this case, the battery charge section 204 can be dispensed with.

The differential communication section 207 is a circuit for performing differential communication with the camera 100 and is capable of transmitting and receiving data to and from the camera 100. The external communication interface section 208 is an interface circuit for performing data communication with an external device, not shown, and is an Ethernet communication interface, a wireless LAN communication interface, a public network communication interface, or the like. The accessory controller 201 controls the differential communication section 207 and the external communication interface section 208, whereby it is possible to transmit data received from the camera 100 to an external device, and inversely, data received from the external device to the camera 100.

The function section 206 has a different function according to the type of the accessory 200. For example, in a case where the accessory 200 is a strobe device, the function section 206 is comprised of a light emission circuit and a charge circuit. In a case where the accessory 200 is a microphone device, the function section 206 is comprised of an audio codec circuit and a microphone circuit.

The external connection terminal 209 is for connection to an external device, and in the present embodiment, is a USB type-C connector. The connection detection section 210 is for detecting that an external device is connected to the external connection terminal 209. The accessory controller 201 receives an output signal from the connection detection section 210, thereby detecting that an external device is connected to the external connection terminal 209.

The power switch 203 is for turning on/off the main power supply of the accessory 200. The accessory controller 201 is capable of detecting whether the power switch 203 is in an on position or in an off position by reading a signal level of a terminal connected to the power switch 203. The operation switches 212 are used for operating the accessory 200, and are formed by a button, a cross key, a slide switch, a dial switch, and the like. The accessory controller 201 detects an operation performed on any of the operation switches 212 and performs predetermined processing according to a result of detection.

The accessory connection section 211 is a connector for electrically connecting to the camera 100 via twenty-one contacts TA01 to TA21 arranged in a line. The contacts TA01 to TA21 are arranged in a line from one end to the other end in this order.

A contact TA01 as a third ground contact of the accessory connection section 211 is connected to ground, and serves not only as a contact of the reference potential but also as a contact for controlling wiring impedance of the differential signal D1N and the differential signal D1P. A contact TA02 and a contact TA03 are connected to the differential communication section 207. The differential signal D1N is connected to the contact TA02 and the differential signal D1N is connected to the contact TA03. The differential signal D1N and the differential signal D1P are differential data communication signals that perform data communication as a pair. The contacts TA02 and TA03, contacts TA07 to TA17, TA19, and TA20 are communication contacts.

A contact TA04 as a first ground contact is connected to ground and serves as a contact of the reference potential of the camera 100 and the accessory 200. A contact TA05 as a power supply contact has the accessory power supply section 202 and the charge section 204 connected thereto and is connected to the accessory power supply VACC supplied from the camera 100. The contact TA04 is disposed on an outer side of the contact TA05 in the direction of arrangement of contacts.

A contact TA06 as a mounting detection contact is directly connected to ground so as to set the accessory mounting detection signal/ACC_DET to ground level (ground potential) as the low level when the accessory 200 is connected to the camera 100. This enables the camera 100 to detect mounting of the accessory 200 thereon. The SCLK signal connected to a contact TA07, the MOSI signal connected to a contact TA08, the MISO signal connected to a contact TA09, and the CS signal connected to a contact TA10 are signals for the accessory controller 201 to perform SPI communication as a communication slave.

A contact TA11 has the communication request signal/WAKE connected thereto for requesting the camera 100 to perform communication. In a case where the accessory controller 201 determines that it is necessary to communicate with the camera 100 (the camera controller A 101), the accessory controller 201 outputs the communication request signal/WAKE at the low level, thereby requesting the camera 100 to perform communication.

According to detection of a mounted state of the accessory 200, power supply from the camera controller A 101 to the accessory 200 via the contact TC05 is performed. Then, the accessory controller 201 notifies the camera controller A 101 that power is supplied, by changing the signal level (potential) of the communication request signal/WAKE from the high level to the low level.

The accessory controller 201 is capable of notifying that there has occurred a cause making it necessary for the accessory 200 to communicate with the camera 100, by changing the signal level (potential) of the communication request signal \WAKE from the high level to the low level without being requested by the camera 100 to communicate. With this configuration, the camera controller A 101 can omit an operation for periodically checking whether or not there has occurred a cause making it necessary for the accessory 200 to communicate with the camera 100, by polling. Further, in a case where there has occurred a cause making it necessary to perform communication, the accessory controller 200 is capable of notifying the camera 100 of the fact in real time.

The SDA signal connected to a contact TA12 and the SCL signal connected to a contact TA13 are signals for the accessory controller 201 to perform I2C communication as a communication slave.

The FNC1 signal, the FNC2 signal, the FNC3 signal, and the FNC4 signal connected to a contact TA14, a contact TA15, a contact TA16, and a contact TA17, respectively, are signals (function signals) capable of changing the functions thereof according to the type of the accessory 200. For example, in a case where the accessory 200 is a microphone device, a corresponding one of the function signals is an audio data signal, and in a case where the accessory 200 is a lighting device (strobe device), a corresponding one of the function signals is a signal notifying light emission timing.

A contact TA18 as a second ground contact is connected to ground, and similar to the contact TA04 as the first ground contact, the potential of the contact TA 18 serves as the reference potential of the camera 100 and the accessory 200. A contact TA19 and a contact TA20 are connected to the external connection terminal 209. The differential signal D2N is connected to the contact TA19 and the differential signal D2P is connected to the contact TA20. The differential signals D2N and D2P are data communication signals that perform data communication as a pair. A contact TA21 as a fourth ground contact is connected to ground.

The contacts TA01, TA04, TA06, TA18, and TA21 are connected e.g. to a ground portion of a flexible circuit board, not shown, of the accessory 200. The ground portion of the flexible circuit board is fixed to a metallic member of which the potential is at ground level of the accessory 200, with screws, not shown or the like. The metallic member of which the potential is at ground level is a shoe mounting leg for engagement with the accessory shoe of the camera 100, or a base plate, not shown, inside the accessory 200.

Figure 7:
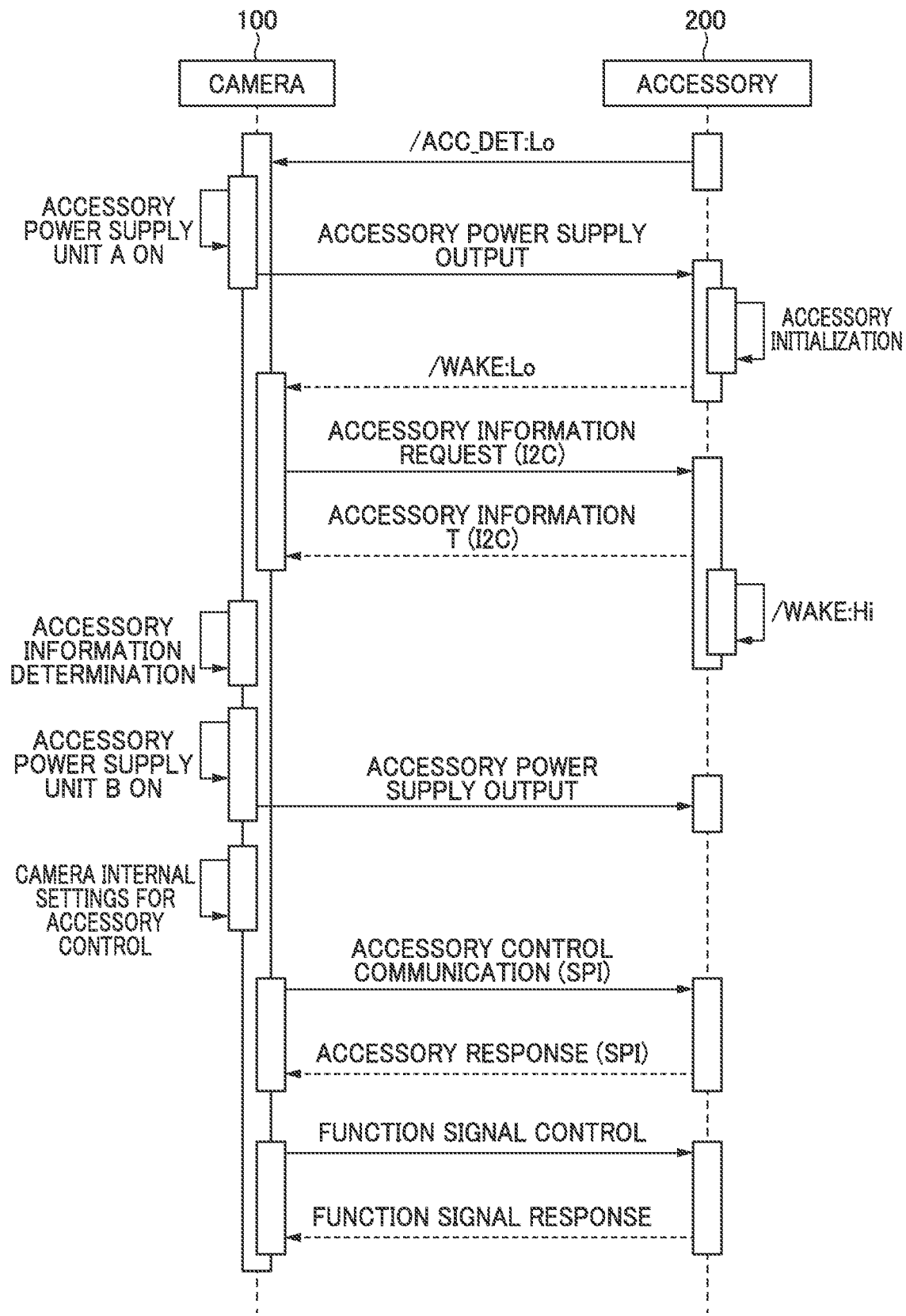
FIG. 7 is a sequence diagram showing a process performed by the accessory and the camera.

Next, the outline of a process performed when the accessory 200 is mounted on the camera 100 will be described with reference to FIG. 7. FIG. 7 is a sequence diagram illustrating an example of processing operations executed when the accessory 200 is mounted on the camera 100.

When the accessory 200 is mounted on the camera 100, the accessory mounting detection signal/ACC_DET is brought to ground level, whereby the camera controller A 101 determines that the accessory 200 is mounted on the camera 100. Upon determining that the accessory 200 is mounted, the camera controller A 101 sets the power supply control signal CNT_VACC1 to the high level so as to turn on the output of the accessory power supply unit A 131. The accessory power supply unit A 131 outputs the accessory power supply VACC to the accessory 200 according to the change of the power supply control signal CNT_VACC1 to the high level.

In the accessory 200, upon receiving the accessory power supply VACC, the accessory power supply 202 generates a power supply VMCU_A for operating the accessory controller 201, and the accessory controller 201 is started up by received the power supply VMCU_A. After being started up, the accessory controller 201 initializes the components of the accessory 200. Thereafter, when the accessory 200 becomes capable of communicating with the camera 100, the accessory controller 201 sets the communication request signal/WAKE (contact TA11) to the low level.

In the camera 100, when the camera controller A 101 detects the low level of the communication request signal/WAKE (TC11), the camera controller A 101 determines that communication with the accessory 200 is established. Then, the camera controller A 101 requests, by I2C communication, the accessory 200 (the accessory controller 201) to transmit accessory information.

FIG. 6 is a diagram showing an example of accessory information stored in the nonvolatile memory (not shown) of the accessory controller 201. The accessory information is for causing the camera 100 to identify the type of the accessory 200 and specifications concerning communication and operations (functions) of the same. The accessory information is mapped in a memory space of addresses of 0x00 to 0x0F (hereafter referred to e.g. as "address 0x0F"). The camera controller B 102 is capable of reading the accessory information from the accessory 200 by I2C communication, in place of the accessory controller 201. It is assumed that in I2C communication of the present embodiment, a checksum on the read data is added as last data of I2C communication. Details of the accessory information will be described hereinafter.

In the accessory 200, in response to the request of accessory information from the camera 100, the accessory controller 201 transmits the accessory information stored therein to the camera controller A 101. After transmitting the accessory information to the camera controller A 101, the accessory controller 201 sets the communication request signal/WAKE to the high level. In the camera 100, the camera controller A 101 determines, based on the received accessory information, whether or not the it is possible to control the accessory 200. Further, the camera controller A 101 turns on the accessory power supply unit B 132.

After completing a variety of settings of the camera 100, the camera controller A 101 notifies the camera controller B 102 of the accessory information. The camera controller B 102 performs notification of control commands to the accessory 200 and control of function signals, based on the accessory information. The accessory controller 201 performs control responsive to the control commands and the function signals by SPI communication from the camera 100.

Next, the accessory information (see FIG. 6) stored in the accessory 200 will be described. Data D7 to D0 at address 0x00 represents information indicating a type of an accessory (hereafter referred to as "accessory type information"). FIG. 8 shows an example of the accessory type information. For example, number 0x81 indicates that the accessory is a strobe device, and number 0x82 indicates that the accessory is an interface conversion adapter device. Further, number 0x83 indicates that the accessory is a microphone device, and number 0x84 indicates that the accessory is a multi-accessory connection adapter device for mounting a plurality of accessory devices on the camera 100.

Here, the adapter device is an intermediate accessory mounted between the camera 100 and an accessory, such as a strobe device or a microphone device. The interface conversion adapter device is an adapter device that converts, in a case where an interface of the camera 100 and an interface of an accessory are different, the interfaces so as to make the camera 100 and the accessory compatible with each other. The multi-accessory connection adapter is an adapter device that is capable of having a plurality of accessories mounted thereon.

Data of D7 to D0 at address 0x01 represents information indicating a model number (identification number) of the accessory 200. Through this information and the accessory type information, it is possible to uniquely identify the accessory 200. Data of D7 to D0 at address 0x02 represents information indicating a version of firmware of the accessory 200. Note that "ACC" in the rows of address 0x01 and 0x02 is used here as an abbreviation of "accessory".

Data of D7 and D6 at address 0x03 represents information indicating whether or not to request supply of the accessory power supply VACC when the camera 100 is in the power-off state. As the values of this information, a value of 0 is used in a case where power supply is not required, a value of 1 is used in a case where power supply by the accessory power supply unit A 131 is to be requested, and a value of 2 is used in a case where power supply by the accessory power supply unit B 132 is to be requested.

Data of D5 to D4 at address 0x03 represents whether or not to request supply of the accessory power supply VACC to the accessory 200 when the camera 100 is set to an energy saving mode by an auto power-off function or the like. As the values of this information, a value of 0 is used in a case where power supply is not required, a value of 1 is used in a case where power supply by the accessory power supply unit A 131 is to be requested, and a value of 2 is used in a case where power supply by the accessory power supply unit B 132 is to be requested.

Data of D3 to D2 at address 0x03 represents information indicating whether or not the accessory 200 includes the battery 205. As the values of this information, a value 0 is used in a case where the accessory 200 does not include the battery 205, whereas a value of 1 is used in a case where the accessory 200 includes the battery 205. Data of D1 to D0 at address 0x03 represents information indicating whether or not the accessory 200 is equipped with a function of charging the battery 205. As the values of this information, a value of 0 is used in a case where the accessory 200 is not equipped with the function of charging the battery 205, whereas a value of 1 is used in a case where the accessory 200 is equipped with the function of charging the battery 205.

Data of D7 to D0 at address 0x04 represents information indicating requested power of the accessory power supply VACC to be supplied to the accessory 200 from the camera 100. For example, it is assumed that the information indicates a value of electric current, which is equal to a tenfold of the value of the information. For example, in a case where the value of the information is "ten", it indicates an electric current of 100 mA, and in a case where the value of the same is "100", it indicates an electric current of 1 A.

To reduce the amount of the information, the information may be associated with a predetermined electric current value. For example, when requesting 100 mA of electric current, 300 mA of electric current, 450 mA of electric current, and 600 mA of electric current, a value of 0, a value of 1, a value of 3, a value of 4 may be used, as respective values of the information.

Data of D7 at address 0x05 represents information indicating whether or not the accessory 200 is in a firmware update mode. As the values of this information, in a case where the accessory 200 is not in the firmware update mode, a value of 0 is used, and in a case where the accessory 200 is in the firmware update mode, a value of 1 is used. Data of D6 at address 0x05 represents information indicating whether the accessory 200 is equipped with a firmware update function. As the values of this information, in a case where the accessory is not equipped with firmware update function, a value of 0 is used, and in a case where the accessory is equipped with firmware update function, a value of 1 is used.

Data of D5 to D4 at address 0x05 represents information indicating whether or not to permit the accessory 200 to operate when mounted on the camera 100 via an intermediate connection accessory. As the values of this information, in the case of not permitting the operation, a value of 0 is used, whereas in the case of permitting the operation, a value of 1 is used. Data of D3 to D2 at address 0x05 represents information whether or not it is required to check a mounted state of the intermediate connection accessory at the time of start-up of the camera 100. As the values of this information, in a case where it is not required to check the mounted state, a value of 0 is used, and in a case where it is required to check the mounted state, a value of 1 is used. Data of D1 to D0 at address 0x05 represents information whether or not the accessory 200 is compatible with command notification by I2C. As the values of this information, in a case where the accessory 200 is not compatible with command notification, a value of 0 is used, and in a case where the accessory 200 is compatible with command notification, a value of 1 is used.

Data of D5 to 54 at address 0x06 represents information indicating a communication method that is, after notification of the communication request signal/WAKE to the camera 100, capable of notifying a cause of the communication request to the camera 100. As the values of this information, in a case where I2C is capable of performing the notification, a value of 0 is used, in a case where SPI communication is capable of performing the notification, a value of 1 is used, and in a case where both of I2C and SPI communication are capable of performing the notification, a value of 2 is used.

Data of D3, data of D2, data of D1, and data of D0 at address 0x06 represent information whether or not the accessory 200 is equipped with a communication function using the FNC1 signal, the FNC2 signal, the FNC3 signal, and FNC4 signal which are function signals, respectively. The data of D0, data of D1, data of D2, and data of D3 correspond to the FNC1 signal, the FNC2 signal, the FNC3 signal, and FNC4 signal, respectively, and as the values of this information, in a case where the associated communication function is not equipped, a value of 0 is used, and in a case where the associated communication function is equipped, a value of 1 is used.

Data of D7 at address 0x0A represents information indicating whether or not to request the camera 100 to start up when the accessory 200 notifies the communication request signal/WAKE to the camera 100. As the values of this information, in the case of requesting the camera 100 to start up, a value of 0 is used, and in the case of not requesting the camera 100 to start up, a value of 1 is used.

Data of D6 to D0 at address 0x0A represents information indicating the cause of the communication request signal/WAKE notified by the accessory 200 to the camera 100. FIG. 9 is a diagram showing an example of causes of notification of the communication request signal/WAKE. The causes of notification of the communication request signal/WAKE shown in FIG. 9 occur in a case where the accessory 200 is a microphone device. In FIG. 9, a cause number of 0x00 indicates that a menu call switch of the operation switches 212 is depressed. Further, a cause number of 0x01 indicates that the accessory 200 has completed the output control of audio signals, and a cause number of 0x02 indicates that the accessory 200 has terminated the muting of the audio signals. Thus, it is possible for the accessory 200 to notify information on the cause of the communication request signal/WAKE.

Data of D1 at address 0x0C in FIG. 6 represents information indicating an SPI communication protocol with which the accessory 200 is compatible. As the values of this information, in a case where the accessory 200 is compatible with the SPI protocol A, a value of 0 is used, and in a case where the accessory 200 is compatible with the SPI protocol B, a value of 1 is used. Data of D0 at address 0x0C represents information indicating control logic of a CS signal of SPI communication with which the accessory 200 is compatible. As the values of this information, in a case where the CS signal is low active, a value of 0 is used, and in a case where the CS signal is high active, a value of 1 is used.

Data of D7 to D0 at address 0x0D represents information indicating a time period required as an interval between communication bytes in a case where the accessory 200 performs communication with the SPI protocol A, and also the accessory 200 is not in the firmware update mode (data of D7 at address 0x05 is 0). FIG. 10A shows an example of time periods each required as the interval between communication bytes, which is indicated by the data at address 0x0D. Further, data of D7 to D0 at address 0x0E represents information indicating a time period required as an interval between communication bytes in a case where the accessory 200 performs communication with the SPI protocol A, and also the accessory 200 is in the firmware update mode (data of D7 at address 0x05 is 1). FIG. 10B shows an example of time periods each required as the interval between communication bytes, which is indicated by the data at address 0x0E.

Figure 11:
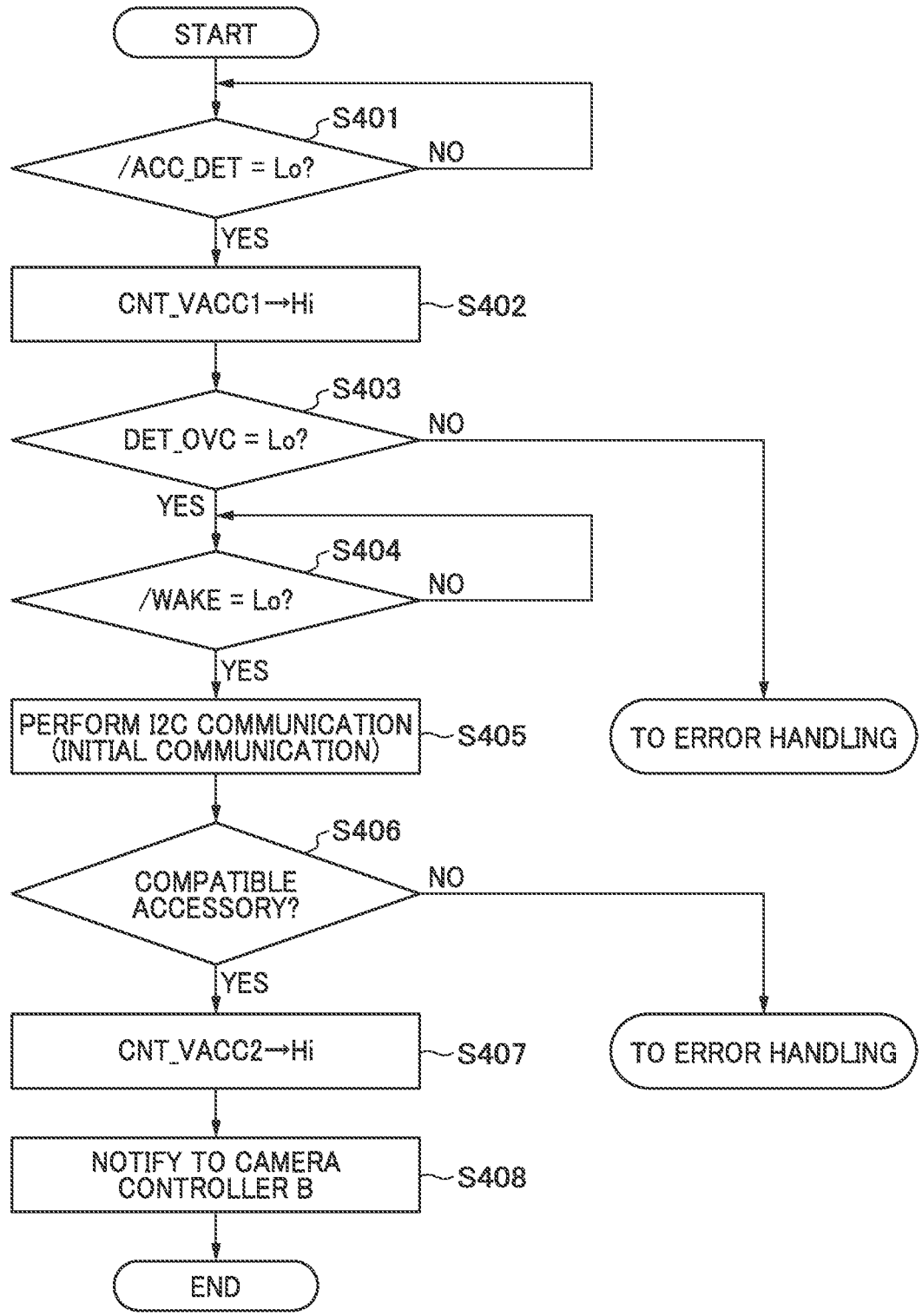
FIG. 11 is a flowchart of a process performed by the camera after having the accessory mounted thereon.

FIG. 11 a flowchart of a process performed by the camera controller A 101 after the accessory 200 is mounted on the camera 100 until the functions of the accessory 200 are activated. In FIG. 11, each processing operation (step) indicated by S number is realized by the CPU of the camera controller A 101 loading a predetermined program stored in the ROM of the camera controller A 101 into the RAM of the same.

In a step S401, the camera controller A 101 monitors the signal level of the accessory mounting detection signal/ACC_DET to determine whether or not the accessory 200 is mounted. More specifically, the camera controller A 101 determines whether the accessory mounting detection signal/ACC_DET is at the low level or at the high level. In a case where the accessory mounting detection signal/ACC_DET is determined to be at the low level, it is determined that the accessory 200 is mounted, and in a case where the accessory mounting detection signal/ACC_DET is determined to be at the high level, it is determined that the accessory 200 is not mounted. In the case where it is determined that the accessory mounting detection signal/ACC_DET is at the high level (No to the step S401), the determination in the step S401 is repeated, and in the case where it is determined that the accessory mounting detection signal/ACC_DET is at the low level (Yes to the step S401), the process proceeds to a step S402.

In a step S402, the camera controller A 101 controls the power supply control signal CNT_VACC1 to the high level to turn on the output of the accessory power supply unit A 131. The accessory power supply unit A131 outputs the accessory power supply VACC when the power supply control signal CNT_VACC1 goes high.

In a step S403, the camera controller A 101 monitors the signal level of the overcurrent detection signal DET_OVC, to determine whether or not overcurrent flows. More specifically, in a case where the overcurrent detection signal DET_OVC is at the low level, the camera controller A 101 determines that no overcurrent flows, and in a case where the overcurrent detection signal DET_OVC is at the high level, the camera controller A 101 determines that overcurrent flows. In a case where it is determined that the overcurrent detection signal DET_OVC is at the low level (Yes to the step S403), the process proceeds to a step S404, whereas in a case where it is determined that the overcurrent detection signal DET_OVC is at the high level (No to the step S403), the present process is terminated and error handling is performed.

In the step S404, the camera controller A 101 monitors the signal level of the communication request signal/WAKE transmitted from the accessory 200 to detect whether or not the initialization of the accessory 200 is completed. More specifically, in a case where the communication request signal/WAKE is at the low level, the camera controller A 101 determines that the initialization of the accessory 200 is completed, whereas in a case where the communication request signal/WAKE is at the high level, the camera controller A 101 determines that the initialization of the accessory 200 is not completed. In a case where it is determined that the communication request signal/WAKE is at the high level (No to the step S404), the camera controller A 101 repeats the determination in the step S404, whereas in a case where it is determined that the communication request signal/WAKE is at the low level (Yes to the step S404), the process proceeds to a step S405.

In the step S405, the camera controller A 101 performs I2C communication with the accessory 200 to read 15 bytes of the accessory information. In a step S406, the camera controller A 101 determines, based on the read accessory information, whether or not the accessory 200 mounted on the camera 100 is a device compatible with the camera 100 (hereafter referred to as "a camera compatible accessory"). In a case where it is determined that the mounted accessory is not a camera compatible accessory (No to the step S406), the present process is terminated and error handling is performed. In a case where it is determined that the mounted accessory is a camera compatible accessory, the process proceeds to a step S407.

In the step S407, the camera controller A 107 controls a power supply control signal CNT_VACC2 to the high level so as to turn on the output of the accessory power supply unit B 132. When the power supply control signal CNT_VACC2 goes high, the accessory power supply unit B 132 outputs the accessory power supply VACC. Note that in the present embodiment, in a case where the power supply control signalCNT_VACC1 and the power supply control signal CNT_VACC2 are both controlled to the high level, it is assumed that the accessory power supply VACC is output by the accessory power supply unit B 132. In a step S408, the camera controller A 101 notifies the accessory information read in the step S405 to the camera controller B 102, followed by terminating the present process.

Figure 12:
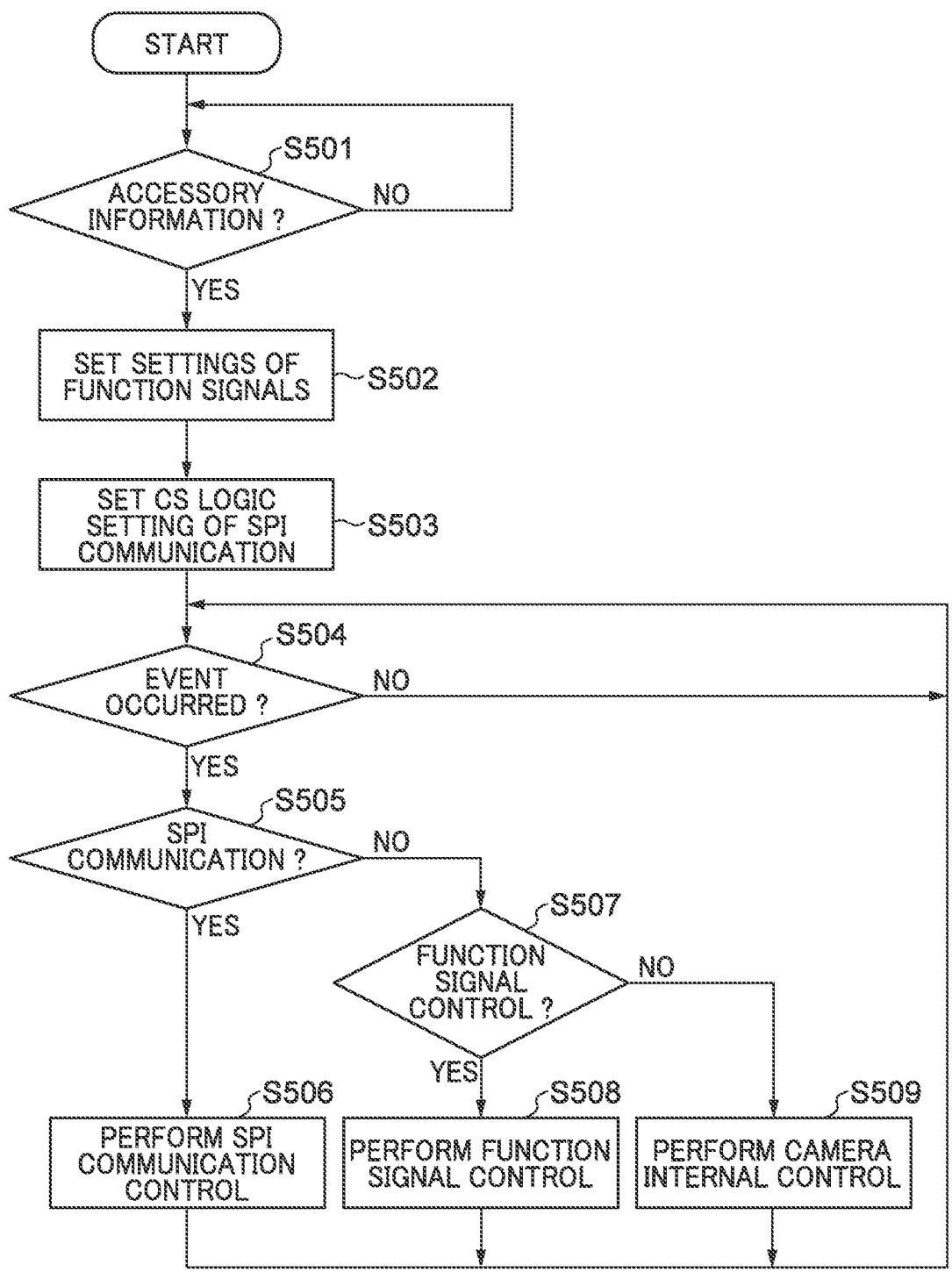
FIG. 12 is a flowchart of a process performed by the camera for activating functions of the accessory.

FIG. 12 is a flowchart of a process performed by the camera controller B 102 after the accessory 200 is mounted on the camera 100 until the functions of the accessory 200 are activated. In FIG. 12, each processing operation (step) indicated by S number is realized by the CPU of the camera controller B 102 loading a predetermined program stored in the ROM of the camera controller B 102 into the RAM of the same.

In a step S501, the camera controller B 102 determines whether or not the accessory information has been notified from the camera controller A 101. In a case where it is determined that the accessory information has not been notified (No to the step S501), the determination in the step S501 is repeated, whereas in a case where it is determined that the accessory information has been notified (Yes to the step S501), the process proceeds to a step S502.

In a step S502, the camera controller B 102 sets settings of the function signals FNC1 to FNC4 based on the accessory information notified from the camera controller A 101. For example, in a case where it is notified that the accessory 200 is a microphone device, the function signals FNC1, FNC2, and FNC3, are set to an audio data clock signal BCLK, an audio data channel signal LRCLK, and an audio data signal SDATA, respectively. As another example, in a case where it is notified that the accessory 200 is a strobe device, the function signal FNC4 is set to a strobe light emission synchronization signal XOUT. Note that as for function signals not requiring the control of the accessory 200, predetermined settings are set so as to prevent operations of the camera 100 and the accessory 200 from being hindered.

In a step S503, the camera controller B 102 sets a setting of the control logic of the CS signal of SPI communication, based on the accessory information notified from the camera controller A 101. In a step S504, the camera controller B 102 determines whether or not a predetermined event has occurred on the accessory 200. In a case where it is determined that the predetermined event has not occurred (No to the step S504), the camera controller B 102 repeats the determination in the step S504, whereas in a case where it is determined that the predetermined event has occurred (Yes to the step S504), the process proceeds to a step S505.

In the step S505, the camera controller B 102 determines whether or not the event detected in the step S504 is an event requiring SPI communication with the accessory 200. In a case where it is determined that the detected event is an event requiring SPI communication (Yes to the step S505), the process proceeds to a step S506, whereas in a case where it is determined that the detected event is not an event requiring SPI communication (No to the step S505), the process proceeds to a step S507.

In the step S506, the camera controller B 102 performs SPI communication with the accessory 200. For example, as SPI communication performed in a case where the accessory 200 is a microphone device, there may be mentioned communication for instructing e.g. switching of on/off of operation of the microphone device, switching of sound collection directivity of the microphone device, and switching of an equalizer function of the microphone device. Further, as SPI communication performed in a case where the accessory 200 is a strobe device, there may mentioned e.g. communication for reading settings information of the strobe device and communication for notifying settings information to the strobe device. After the step S506, the process returns to the step S504.

In the step S507, the camera controller B 102 determines whether or not the event detected in the step S504 is an event requiring to perform control using function signals in communication with the accessory 200. In a case where it is determined that the detected event is an event requiring control using function signals (Yes to the step S507), the process proceeds to a step S508, whereas in a case where it is determined that the detected event is an event not requiring control using function signals (No to the step S507), the process proceeds to a step S509.

In the step S508, the camera controller B 102 performs control of the accessory 200 using the function signals. In a case where the accessory 200 is a microphone device, as the control performed in the step S508, there may be mentioned control for taking in the audio data channel signal LRCLK as the function signal FNC3, in synchronism with the start of output of the audio data clock signal BCLK as the function signal FNC1 and the audio data channel signal LRCLK as the function signal FNC2. This makes it possible to acquire audio data from the accessory 200. Further, in a case where the accessory 200 is a strobe device, as the control performed in the step S508, there may be mentioned control of the strobe light emission synchronization signal XOUT as the function signal FNC4 at a desired timing. This enables the camera 100 to notify instruction for light emission to the strobe device. After the step S508, the process returns to the step S504.

In the step S509, the camera controller B 102 performs a predetermined camera internal control according the event detected in the step S504. As the camera internal control in a case where the accessory 200 is a microphone device, there may be mentioned control of start/stop of recording audio data in the recording memory 126, control of equalizer processing on audio data, and so forth. Further, as the camera internal control in a case where the accessory 200 is a strobe device, there may be mentioned control of photometry by the image sensor 122, which is performed by causing the strobe device to emit light, control of calculating an instruction value of the amount of emission by the strobe device, and so forth. After the step S509, the process returns to the step S504.

By performing the processes shown in FIGS. 11 and 12, the camera 100 is capable of performing control of the accessory 200 mounted on the camera 100. Note that details of the process by the camera controller B 102 are as described above, but the process in FIG. 12 does not include a termination step. The process in FIG. 12 is terminated, e.g. when an operation is performed on the camera 100 for stopping using the accessory 200 or an operation for powering off the camera 100 or the accessory 200 is performed during execution of the determination in the step s504.

Figure 13:
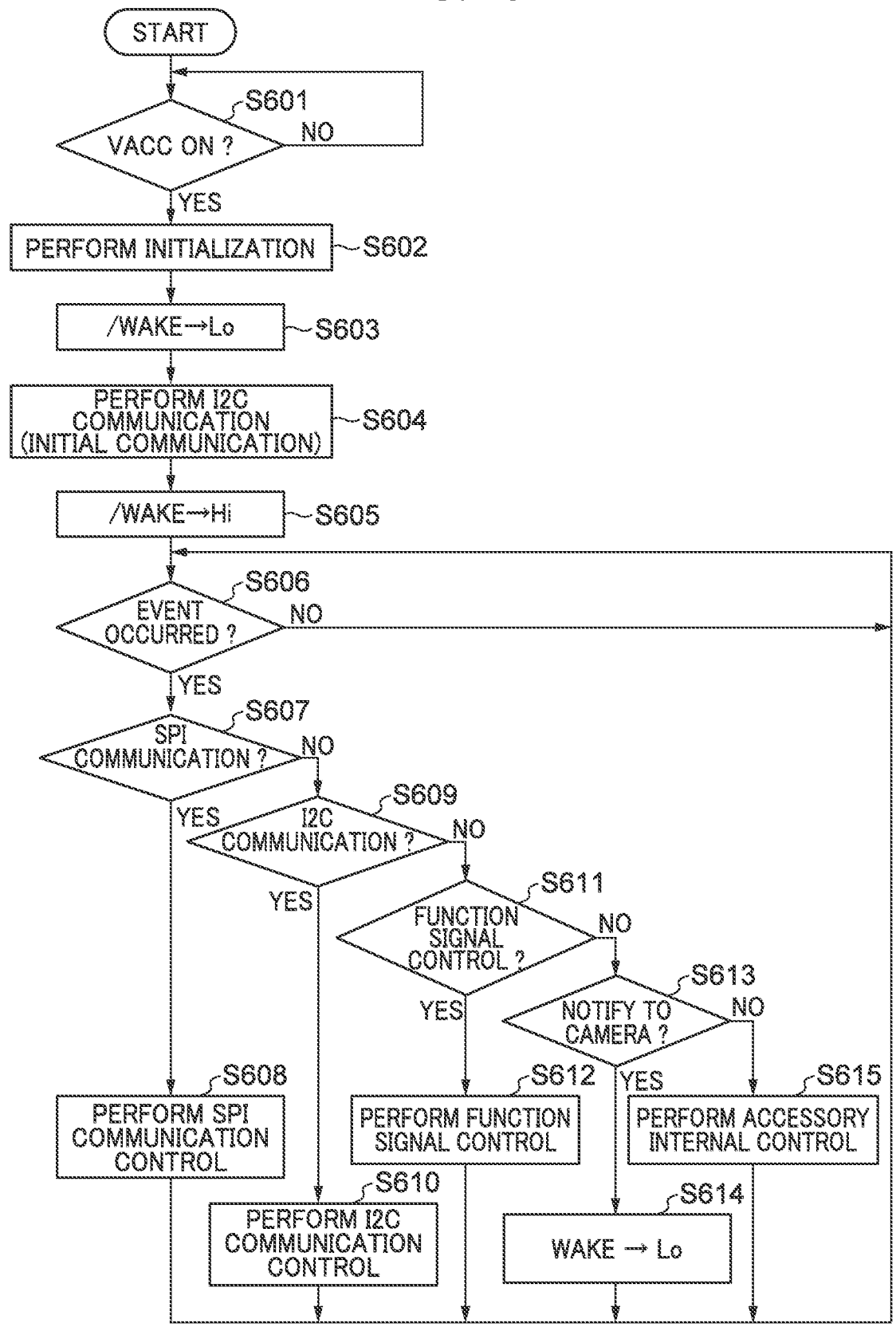
FIG. 13 is a flowchart of a process performed by the accessory mounted on the camera.

FIG. 13 is a flowchart of a process performed by the accessory controller 201 after the accessory 200 is mounted on the camera until the functions of the accessory 200 operate. In FIG. 13, each processing operation (step) indicated by S number is realized by the CPU of the accessory controller 201 loading a predetermined program stored in the ROM of the accessory controller 201 into the RAM of the same.

In a step S601, the accessory controller 201 determines whether or not supply of the accessory power supply VACC from the camera 100 is started (the accessory power supply VACC is turned on). Here, in a case where the accessory 200 is not provided with the battery 205, the accessory controller 201 determines that the accessory power supply VACC is turned on, from the fact that power is supplied to the accessory controller 201 and the accessory controller 201 itself is started to operate. In a case where the accessory 200 is provided with the battery 205, the accessory controller 201 is capable of detecting start of the supply of the accessory power supply VACC by monitoring the voltage value of the accessory power supply VACC. In a case where it is determined that the accessory power supply VACC is not on (No to the step S601), the accessory controller 201 repeats the determination in the step S601, whereas in a case where it is determined that the accessory power supply VACC is on (Yes to the step S601), the process proceeds to a step S602.

In the step S602, the accessory controller 201 performs initialization. For example, the accessory controller 201 sets a setting of an operating frequency range of the accessory controller 201 itself, settings of input and output control ports of the microcomputer, an initialization setting of a timer function of the microcomputer, an initialization setting of an interrupt function of the microcomputer, and so forth. In a step S603, the accessory controller 201 controls the communication request signal/WAKE to the low level. With this, completion of initialization of the accessory 200 is notified from the accessory controller 201 to the camera 100. In a step S604, the accessory controller 201 responds to I2C communication from the camera 100 to transmit 15 bytes of the accessory information. The accessory information includes a variety of information shown in FIG. 6. In a step S605, the accessory controller 201 controls the communication request signal/WAKE to the high level.

In a step S606, the accessory controller S606 determines whether or not a predetermined event has occurred. In a case where it is determined that no predetermined event has occurred (No to the step S606), the accessory controller 201 repeats the determination in the step S601 (Yes to the step S606), whereas in a case where it is determined that a predetermined event has occurred, the process proceeds to a step S607.

In the step S607, the accessory controller 201 determines whether or not the occurred event is an event requiring SPI communication with the camera 100. In a case where it is determined that the occurred event is an event requiring SPI communication with the camera 100 (Yes to the step S607), the process proceeds to a step S608, whereas if it is determined that the occurred event is not an event requiring SPI communication with the camera 100 (No to the step S607), the process proceeds a step S609.

In the step S608, the accessory controller 201 performs SPI communication with the camera 100. In a case where the communication request signal/WAKE is at the low level during execution of SPI communication, the accessory controller 201 changes the communication request signal/WAKE to the high level after execution of SPI communication. As SPI communication performed in a case where the accessory 200 is a microphone device, there may be mentioned communication for instructing e.g. switching of on/off of operation of the microphone device, switching of sound collection directivity of the microphone device, and switching of the equalizer function of the microphone device. Further, as SPI communication performed in a case where the accessory 200 is a strobe device, there may mentioned e.g. communication for reading settings information of the strobe device and communication for notifying settings information to the strobe device. After the step S608, the process returns to the step S606.

In the step S609, the accessory controller 201 determines whether or not the occurred event is an event requiring I2C communication with the camera 100. In a case where it is determined that the occurred event is an event requiring I2C communication with the camera 100 (Yes to the step S609), the process proceeds to a step S610, whereas it is determined that the occurred event is not an event requiring I2C communication with the camera 100 (No to the step S609), the process proceeds to a step S611.

In the step S610, the accessory controller 201 performs I2C communication with the camera 100. In a case where the communication request signal/WAKE during execution of SPI communication is at the low level, the accessory controller 201 changes the communication request signal/WAKE to the high level. As I2C communication performed in the step S610, there may be mentioned e.g. communication for reading the cause of the communication request, according to notification of the communication request signal/WAKE from the accessory controller 201 to the camera 100. After the step S610, the process returns to the step S606.

In the step S611, the accessory controller 202 determines whether or not the occurred event is an event performing control using function signals. In a case where it is determined that the occurred event is an event performing control using function signals (Yes to the step S611), the process proceeds to a step S612, whereas in a case where it is determined that the occurred event is not an event performing control using function signals (No to the step S612), the process proceeds to a step S613.

In the step S612, the accessory controller 201 performs control of the camera 100 using the function signals. As the control performed in a case where the accessory 200 is a microphone device, there may be mentioned the following controls: The accessory controller 201 performs reception control of the audio data clock signal BCLK as the function signal FNC1 and the audio data channel signal LRCLK as the function signal FNC2, which are output from the camera 100. Then, the accessory controller 201 performs control of outputting the audio data signal SDATA as the function signal FNC3, in synchronism with the received audio data clock signal BCLK and audio data channel signal LRCLK. Further, as the control performed in the step S612 in a case where the accessory 200 is a strobe device, there may be mentioned control of strobe light emission executed in response to reception of the strobe light emission synchronization signal XOUT as the function signal FNC4. After the step S612, the process returns to the step S606.

In the step S613, the accessory controller 201 determines whether or not the occurred event is an event of notification to the camera 100 by the communication request signal/WAKE. In a case where it is determined that the occurred event is an event of notification to the camera 100 by the communication request signal/WAKE (Yes to the step S613), the process proceeds to a step S614, whereas in a case where it is determined that the occurred event is not an event of notification to the camera 100 by the communication request signal/WAKE (No to the step S613), the process proceeds to a step S615.

In the step S614, the accessory controller 201 stores the cause number of the communication request to the camera responsive to the occurred event in the nonvolatile memory of the accessory controller 201 itself and controls the communication request signal/WAKE to the low level. A the cause number of the communication request, a unique number is assigned to each of causes, as described hereinbefore with reference to FIG. 9. After the step S614, the process returns to the step S606.

In the step S615, the accessory controller 201 perform accessory internal control responsive to the occurred event. As the accessory internal control performed in the step S615, there may be mentioned, e.g. detection control of the remaining charge of the battery 205 in a case where the battery 205 is provided in the accessory 200 and detection control of the operation switches 212. After the step S615, the process returns to the step S606.

The process described above with reference to FIG. 13 enables the accessory 200 to perform predetermined function operations after the accessory 200 is mounted on the camera 100. Note that a sequence of processing operations illustrated in FIG. 13 is terminated, for example, in a case where an operation for stopping using the accessory 200 is performed on the camera or an operation for powering off the camera 100 or the accessory 200 is performed, during repeated execution of the determination in the step S606.

Next, a first embodiment of the disclosure will be described. Here, a description will be given of a case where a checksum error has occurred during SPI communication in the step S608 in FIG. 13.

FIG. 14 is a diagram showing another example of details of communication for notifying an operation execution instruction (command) from the camera 100 to the accessory 200 by SPI communication. In the communication shown in FIG. 14, CheckSum_C and CheckSum_A are transmitted at the same timing of transmission of the N-th byte, which makes the communication in FIG. 14 different from the communication shown in FIG. 5. In this case, the camera controller B 102 performs determination on CheckSum_A, and hence in a case where CheckSum_A is erroneous, the camera 100 (camera controller B 102) can perform the same communication again. However, in a case where CheckSum_C is erroneous, the camera 100 cannot perform retransmission processing unless the accessory 200 notifies an error to the camera 100 in some way or another. A method of notifying an error from the accessory 200 to the camera 100 in this case will be described with reference to FIG. 15.

Figure 15:
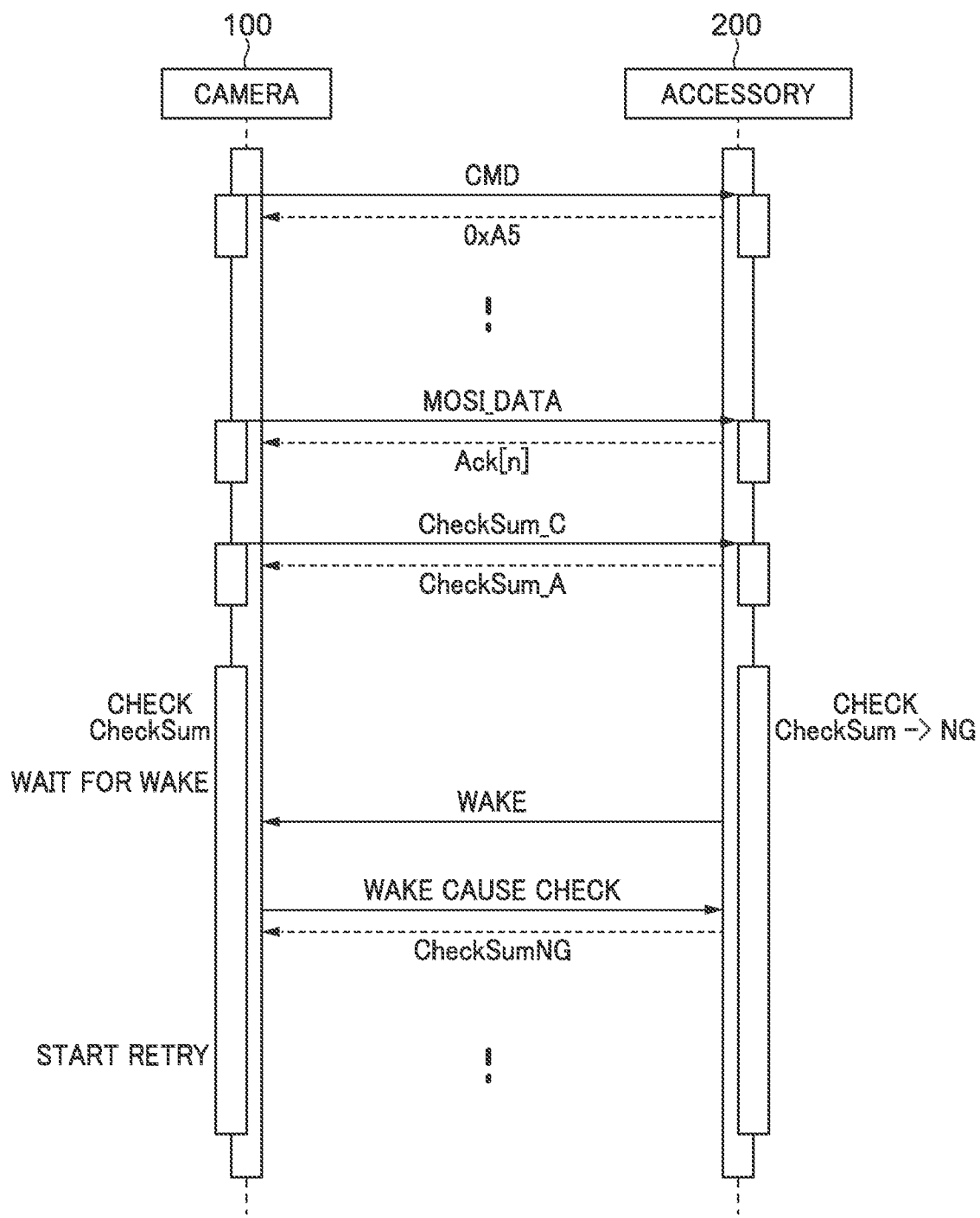
FIG. 15 is a sequence diagram showing another example of a method of notifying an error from the accessory to the camera when a checksum error has occurred.

FIG. 15 is a sequence diagram useful in explaining an example of the method of notifying an error from the accessory 200 to the camera 100 in a case where a checksum error occurs during SPI communication in FIG. 14. In a case where, after determining CheckSum_A, when the camera 100 receives the communication request signal/WAKE before a predetermined time period elapses, the camera 100 acquires the contents of the received communication request and performs processing according to the acquired contents. On the other hand, the accessory 200 determines CheckSum_C. Then, in a case where received CheckSum_C and first CheckSum_C_A calculated by the accessory 200 itself do not match (in the case of NG), the accessory 200 stores a cause number indicative of a checksum error in the address 0x0A and sets the communication request signal/WAKE to the low level. This makes it possible to notify a checksum error from the accessory 200 to the camera 100.

Here, the communication request signal/WAKE is connected to the camera controller A 101 and SPI communication is connected to the camera controller B 102. For this reason, the necessity of performing communication between the camera controller A 101 and the camera controller B 102 complicates processing and is delayed to respond to occurrence of an error.

Figure 16:
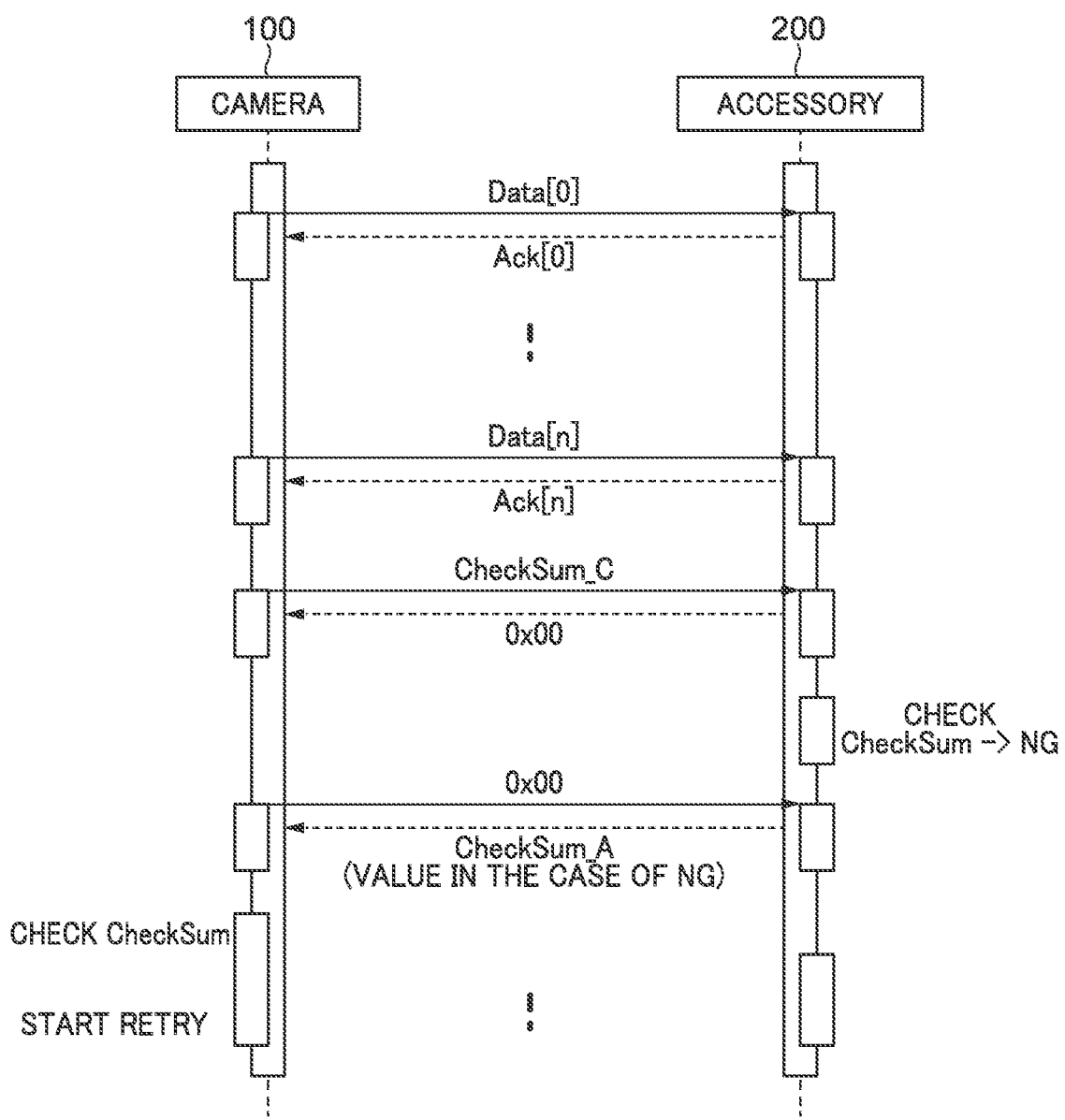
FIG. 16 is a sequence diagram showing a method of notifying an error from the accessory to the camera when a checksum error has occurred, according to a first embodiment.

FIG. 16 is a sequence diagram useful in explaining an example of a method, according to the first embodiment, of notifying an error from the accessory 200 to the camera 100 in the case where a checksum error has occurred during SPI communication in the form illustrated in FIG. 5. According to the form of SPI communication illustrated in FIG. 5, after the camera 100 transmits CheckSum_C by the (N−1)-th byte, the accessory 200 transmits CheckSum_A by the N-th byte. In this case, after receiving CheckSum_C from the camera 100, the accessory controller 201 determines whether or not the value of received CheckSum_C and the value of first CheckSum_C_A calculated by the accessory controller 201 itself from the received data match. Then, in a case where the value of CheckSum_C and the value of CheckSum_C_A match, the accessory controller 201 calculates second CheckSum_A and transmits the same to the camera 100 (the camera controller B 102). On the other hand, in a case where the value of CheckSum_C and the value of CheckSum_C_A do not match, the accessory controller 201 calculates third CheckSum_A by an equation (4) described below.

$$\text{CheckSum}\_A = \text{AND}(\text{SUM}(CMD, \text{MOSI\_DATA1}, \ldots, \text{MOSI\_DATA}[N-3]), 0xFF) \quad (4)$$

This makes it possible for the camera 100 (the camera controller B 102) to check received CheckSum_A, and in a case where no checksum error occurs, perform processing to be performed next, whereas in a case where a checksum error occurs, retransmit the same command.

Thus, by employing a method of transmitting CheckSum_A after receiving CheckSum_C, it is possible for the accessory 200 to notify a checksum error during one communication, and hence it is possible to improve responsiveness at the time of occurrence of a checksum error. Further, since the camera 100 need not be conscious of whether or not an error has occurred in the accessory 200, it is possible to simplify the processing by the camera 100. Further, since the accessory 200 is only required to operate according to the contents of communication from the camera 100, the accessory 200 need not perform special processing other than calculation of the third CheckSum_A, it is possible to simplify processing by the accessory 200.

Note that the camera 100 can know, based on the value of CheckSum_A, whether or not an error has occurred in the accessory 200. More specifically, in a case where the value of CheckSum_A does not assume 0xff of EXOR, it is possible to determine that an error has occurred in the accessory 200. Further, by taking into consideration a case where the checksum error is not a temporary one, but is caused by malfunction of hardware, the number of times of retransmission of the same command may be specified (restricted). In this case, when the checksum error is not improved even after execution of a predetermined number of times of retransmission, it is desirable to shift to error handling.

Next, a second embodiment of the disclosure will be described. Here, a description will be given of a case where a checksum error has occurred during I2C communication in the step S610 in the process in FIG. 13, with reference to FIGS. 17 and 18.

FIG. 17 is a diagram showing another example of accessory information stored in the nonvolatile memory (not shown) of the accessory 200. As described hereinabove, the accessory 200 is compatible with command notification by I2C communication, the value of data of D1 to D0 at address 0x05 is set to 1. In the accessory information shown in FIG. 17, it is assumed that the value of data of D1 to D0 at address 0x05 is set to 1, and that information at address 0x0F is set to "command" in place of "checksum" in the accessory information in FIG. 6. In this case, when a command is written from the camera 100 into address 0x0F of the accessory 200 by I2C communication, the accessory 200 performs processing associated with the command written therein.

Figure 18:
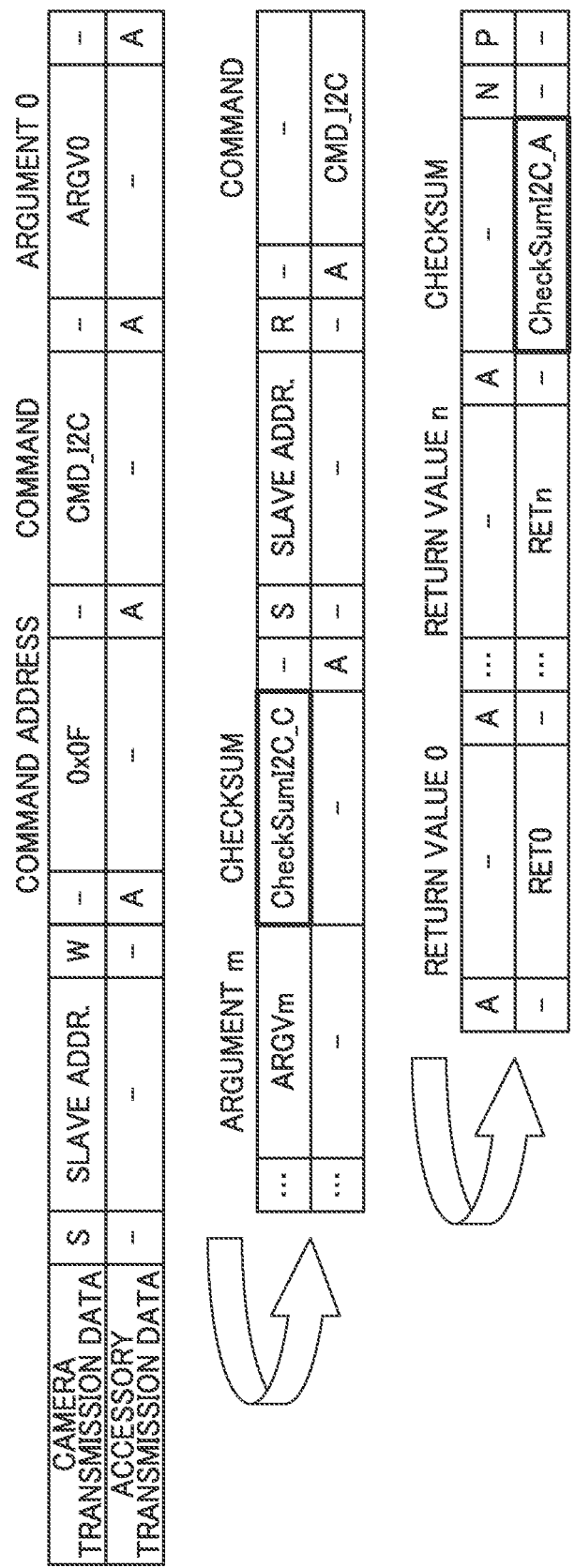
FIG. 18 is a diagram showing an example of contents of I2C communication between the camera and the accessory.

FIG. 18 is a diagram showing an example of details of communication performed between the camera 100 and the accessory 200 by I2C communication. In FIG. 18, an upper row shows transmission signals from the camera 100 to the accessory 200, and a lower row shows transmission signals from the accessory 200 to the camera 100. Further, in FIG. 18, "S" represents start condition, "P" represents stop condition, "W" represents write notification bit, "R" represents read notification bit, "A" represents data reception notification (ACK), and "N" represents data communication completion notification (NACK).

As shown in FIG. 18, a command CMD_I2 is written from the camera 100 into address 0x0F of the nonvolatile memory. Subsequently, the camera 100 transmits arguments ARGV0 to ARGVm required by execution of the command CMD_I2C, and finally CheckSumI2C_C which is a checksum from the camera 100, to the accessory 200. Here, CheckSumI2C_C is calculated by the camera controller B 102 by the following equation (5):

$$\text{CheckSumI2C}\_C = \text{EXOR}(\text{AND}(\text{SUM}(0x0F, CMD\_I2C, ARGV0, \ldots, ARGVm), 0xFF), 0xFF) \quad (5)$$

On the other hand, the accessory 200 returns CMD_I2C received by the first byte after the read notification bit, to the camera 100. Thereafter, the accessory 200 transmits to the camera 100, RET0 to RETn as return values, and CheckSumI2C_A which is a checksum from the accessory 200 to the camera 100.

In doing this, since I2C communication is half duplex communication, CheckSumI2C_C is transmitted from the camera 100 to the accessory 200 when the camera 100 requests writing (WRITE). Then, when reading (READ) is requested thereafter, the accessory 200 transmits CheckSumI2CA to the camera 100. At this time, similar to SPI communication described in the first embodiment, the accessory controller 201 determines whether or not CheckSumI2C_C and a checksum calculated by the accessory controller 201 itself from the received data (hereafter referred to as "CheckSumI2C_C_A") match. In a case where the accessory controller 201 determines that CheckSumI2C_C and CheckSumI2C_C_A match, the accessory controller 201 calculates first CheckSumI2C_A by the following equation (6) and transmits the same to the camera 100. Further, in a case where the accessory controller 201 determines that CheckSumI2C_C and CheckSumI2C_C_A do no match, the accessory controller 201 calculates second CheckSumI2C_A by the following equation (7) and transmits the same to the camera 100. Note that processings by the camera 100 and the accessory 200 based on CheckSumI2C_C and CheckSumI2C_A are the same as in the first embodiment, and hence description thereof is omitted:

$$\text{CheckSumI2C\_A=EXOR(AND(SUM}(CMD\_I2C, RET0,\ldots,RETn),0xFF),0xFF) \quad (6)$$

$$\text{CheckSumI2C\_A=AND(SUM}(CMD\_I2C, RET0,\ldots,RETn),0xFF) \quad (7)$$

Next, a third embodiment of the disclosure will be described. In the first and second embodiments, the values of the checksum transmitted to the camera 100 are differentiated between the case where no checksum error has occurred in the accessory 200 and the case where a checksum error has occurred in the accessory 200 (CheckSum_A and CheckSumC_A). In the third embodiment, another method of coping with a case where a checksum error occurs during SPI communication will be described.

As described hereinabove, the accessory 200 transmits, as MISO signal data, a value of 0xA5 which indicates a state capable of communication, by the first byte of SPI communication. Further, the accessory 200 transmits, as MISO signal data, a value other than 0xA5, in a case where the accessory 200 is incapable of performing communication processing for the first byte.

In this case, if the first byte of MISO signal data is other than 0xA5, the camera 100 retransmits the same command. In the present embodiment, the number of times of retransmission is set to two, and the same command is transmitted up to three times, but in a case where the communication is not successful even at the third time of transmission of the command, the process proceeds to error handling. In this case, if a checksum error occurs in the accessory 200, by always setting the first byte of subsequent communication to a value other than 0xA5, it is possible to shift to error handling.

Alternatively, instead of shifting to error handling, the camera 100 may switch the accessory power supply VACC from off to on. That is, by starting over the communication with the accessory 200, from turning-on of the accessory power supply unit A 131 as in the process described with reference to FIG. 7, it is possible to communicate with the accessory 200 again. Note that, in this case, it is desirable that the camera 100 and the accessory 200 each reset the contents of communication to thereby prevent a malfunction from being caused when the communication is resumed.

Next, a fourth embodiment of the disclosure will be described. In the first and second embodiments, the values of the checksum transmitted to the camera 100 are differentiated between the case where no checksum error has occurred in the accessory 200 and the case where a checksum error has occurred in the accessory 200 (CheckSum_A and CheckSumC_A). In the fourth embodiment, another method of coping with a case where a checksum error occurs during SPI communication and I2C communication will be described.

The camera 100 determines, in a case where a predetermined time period has elapsed in a state of the potential of the MISO signal being at the low level, that time-out has occurred, and performs communication again. In the present embodiment, the number of times of retransmission is set to two, and the same command is transmitted up to three times, but in a case where the communication is not successful even at the third time of transmission of the command, the process proceeds to error handling.

Therefore, in a case where a checksum error has occurred in the accessory 200, by setting the potential (output level) of the MISO signal of next and subsequent communications to the low level, it is possible to shift to error handling. On the other hand, instead of proceeding to error handling, the camera 100 switches the accessory power supply VACC from off to on, to thereby starting over the communication with the accessory 200, from turning-on of the accessory power supply unit A 131 as in the process described with reference to FIG. 7, it is possible to communicate with the accessory 200 again. Note that, in this case, it is desirable that the camera 100 and the accessory 200 each reset the contents of communication to thereby prevent a malfunction from being caused when the communication is resumed.

Next, a fifth embodiment of the disclosure will be described. Here, a still other method of coping with a case where a checksum error occurs during SPI communication and I2C communication will be described. In a case where a checksum error occurs in the accessory 200, as described hereinabove with reference to FIG. 13, the accessory controller 201 stores a cause number indicative of initialization (S602) in the address 0x0A and sets the communication request signal/WAKE to the low level (S603). Then, the camera controller B 102 receives the communication request signal/WAKE and acquires the contents of the communication request, and perform processing according to the acquired contents. This enables the camera 100 and the accessory 200 to establish communication again. Note that, in this case, it is desirable that the camera 100 and the accessory 200 each reset the contents of communication to thereby prevent a malfunction from being caused when the communication is resumed.

Next, a sixth embodiment of the disclosure will be described. A still other method of coping with a case where a checksum error occurs during SPI communication and I2C communication will be described.

The accessory 200 is configured such that in a case where a checksum error occurs in the accessory 200, after the accessory mounting detection signal/ACC_DET is set to the high level for a predetermined time period, the accessory mounting detection signal/ACC_DET can be set to the low level again. With this, the camera controller A 101 determines that, after the accessory 200 is removed from the camera 100, the accessory 200 is mounted again, and hence the accessory controller 201 is capable of starting over the process for communication from the step S601 in FIG. 13. Note that, in this case, it is desirable that the camera 100 and the accessory 200 each reset the contents of communication to thereby prevent a malfunction from being caused when the communication is resumed.

Next, a seventh embodiment of the disclosure will be described. A still other method of coping with a case where a checksum error occurs during SPI communication and I2C communication will be described.

The accessory 200 is configured such that when a checksum error occurs in the accessory 200, the accessory controller 201 resets the firmware of the accessory 200. With this, the accessory controller 201 is capable of starting over the process for communication from the step S601 in FIG. 13. Note that, in this case, it is desirable that the camera 100 and the accessory 200 each reset the contents of communication to thereby prevent a malfunction from being caused when the communication is resumed.

Next, an eighth embodiment of the disclosure will be described. In the embodiments described above, the accessory 200 includes, as the accessory controller 201 for controlling the overall operation of the accessory 200, the microcomputer including the CPU, the nonvolatile memory, and so forth. In contrast, in the present embodiment, a method of coping with a checksum error occurring in the accessory in a case where an accessory including no microcomputer is mounted on the camera 100 will be described.

Figure 19:
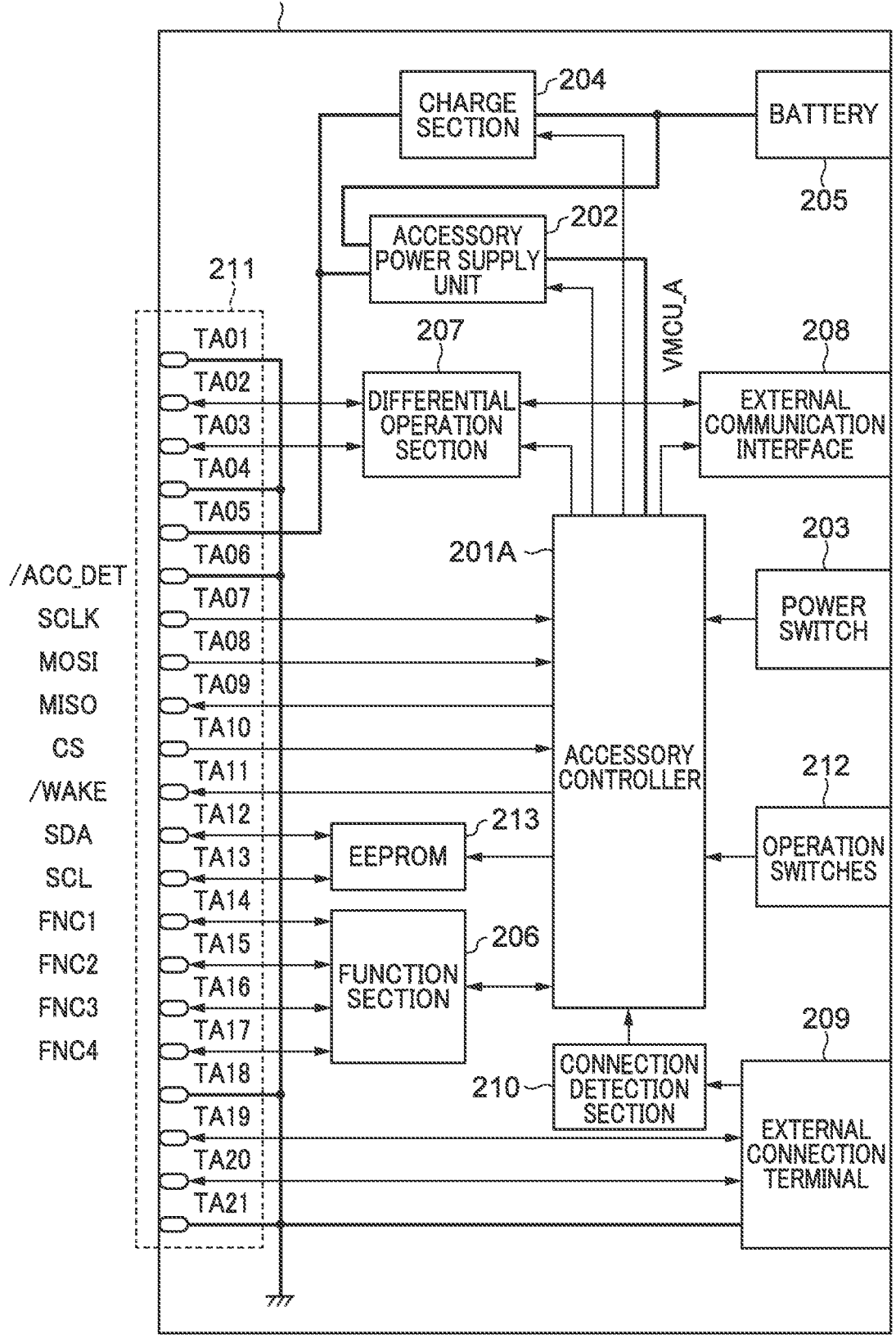
FIG. 19 is a block diagram showing an electrical configuration of another accessory.

FIG. 19 is a block diagram showing an electrical configuration of an accessory 200A. Note that out of the components of the accessory 200A, the same components as those of the accessory 200 appearing in FIG. 1 are denoted by the same reference numerals, and redundant description thereof is omitted. An accessory controller 201A of the accessory 200A is not equipped with a microcomputer incorporating a CPU, a nonvolatile memory, and so forth, and is distinguished from the accessory controller 201 in that the accessory controller 201A performs analog control. Note that the accessory 200A includes, as data storage means, an EEPROM 213 which is a nonvolatile memory.

In the accessory 200A, communication terminals for performing I2C communication between the camera 100 and the accessory 200A are directly connected to the EEPROM 213. The SDA signal of the camera 100 is connected via the contact TA12 of the accessory connection section 211, and the SCL signal of the camera 100 is connected via the contact TA13 of the accessory connection section 211, to the EEPROM 213.

FIG. 20 shows an example of the accessory information stored in the accessory 200A, and shows contents corresponding to those described with reference to FIG. 6 and FIG. 17. The accessory information stored in the accessory 200A is distinguished from the accessory information in the accessory 200 in FIG. 6 in information to be stored in address 0x0B and address 0x0F of a storage area where the accessory information is stored. More specifically, a checksum of 15 bytes of data from address 0x00 to address 0x0E (whole of the accessory information) is stored at address 0x0F at the end of the area, and a checksum of two bytes of data (part of the accessory information), referred to hereinafter, is stored at address 0x0B, instead of causing the address to be reserved. Note that in the accessory 200A, data of D1 to D0 at address 0x05 is set to 0 (zero), which means that the accessory 200A is incompatible with I2C commands.

It is assumed that I2C communication performed between the camera 100 and the accessory 200A after the accessory 200A is mounted on the camera 100 is compatible with two types of read communication method. A first read communication method is a communication method in which address 0x00 is specified as a read start address, and this method is hereinafter referred to as "the read communication method A". In the read communication method A, it is possible to read 15 bytes by one communication. A second read communication method is a communication method in which an address other than address 0x00 is specified as a read start address, and this method is hereinafter referred to as "the read communication method B". In the read communication method B, it is possible to read two bytes by one communication.

Figure 21A:
FIGS. 21A and 21B are diagrams showing examples of contents of I2C communication between the camera and the accessory.

FIG. 21A is a diagram showing an example of contents of communication by the read communication method A, in which an upper row shows transmission signals from the camera 100 to the accessory 200A, and a lower row shows transmission signals from the accessory 200A to the camera 100. Further, in FIG. 21A, "S" represents start condition, "P" represents stop condition, "W" represents write notification bit, "R" represents read notification bit, "A" represents data reception notification (ACK), and "N" represents data communication completion notification (NACK)

As shown in FIG. 21A, in a case where 0x00 is specified as the read start address, 15 bytes from address 0x00 to address 0x0E and a checksum are transmitted from the accessory 200A to the camera 100. The checksum in the read communication method A is calculated by the following equation (8). Here, DATA0 indicates data at address 0x00 and DATA14 indicates data at address 0x0E.

$$\text{CheckSumI2C\_A} = \text{EXOR}(\text{AND}(\text{SUM}(DATA0, \ldots, DATA14), 0xFF), 0xFF) \quad (8)$$

Figure 21B:
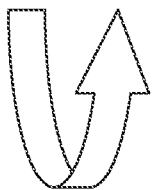

FIG. 21B is a diagram showing an example of contents of communication by the read communication method B, in which an upper row shows transmission signals from the camera 100 to the accessory 200A, and a lower row shows transmission signals from the accessory 200A to the camera 100. As shown in FIG. 21B, as the read start address, address 0x09 other than address 0x00 is specified. In this case, it is assumed that two bytes of data at address 0x09 and address 0x0A and a checksum are transmitted from the accessory 200A to the camera 100. The checksum in the read communication method B is calculated by the following equation (9). In the equation (9), DATA(m) is data at the start address and DATA(m+1) is data at address one byte higher than the start address. In FIG. 21B, DATA(m) corresponds to DATA9 and DATA(m+1) corresponds to DATA10.

$$\text{CheckSumI2C\_A} = \text{EXOR}(\text{AND}(\text{SUM}(DATA(m), DATA(m+1)), 0xFF), 0xFF) \quad (9)$$

In the step S405 (initial communication) in the process described hereinabove with reference to FIG. 11, the camera controller A 101 performs I2C communication with the accessory 200A, and performs reading of 15 bytes of the accessory information (the read communication method A). Then, in the step S406, the camera controller A 101 determines, based on the accessory information read in the step S405, whether or not the accessory 200A is compatible with the camera 100. In a case where the camera controller A 101 determines that the accessory 200A is compatible with the camera 100 (Yes to the step S406), the process proceeds to the step S407, whereas in a case where the camera controller A 101 determines that the accessory 200A is not compatible with the camera 100 (No to the step S406), the process proceeds to error handling. In a case where it is determined in the read communication method A that a checksum error has occurred in the accessory 200A, the camera controller A 101 determines that the accessory 200A is not compatible with the camera 100, and the process proceeds to error handling.

On the other hand, in the step S609 of the process in FIG. 13, the accessory controller 201A determines whether or not the detected event requires I2C communication with the camera 100. Then, in a case where the accessory controller 201A determines that the detected event requires I2C communication with the camera 100, the process proceeds to the step S610 to perform communication related to a checksum by the read communication method B. In the read communication method B, as described hereinabove, it is possible to read two bytes of data by one communication. In a case where the camera controller A 101 determines by the read communication method B that a checksum error has occurred in the accessory 200A, the camera controller A 101 determines that the accessory 200A is incompatible with the camera 100, and the process proceeds to error handling.

Note that the data stored in the EEPROM 213 corresponds to the data shown in FIG. 6, which are fixed values for the accessory 200A. Thus, according to the present embodiment, even for the accessory 200A, which includes no microcomputer, it is possible to detect an error in communication data.

Note that the description of the embodiments is given by focusing mainly on a form in which the accessory 200 is directly mounted on the camera 100, but the embodiments may be in another form. For example, the embodiments may be in a form in which the camera 100 communicates with a main accessory corresponding to the accessory 200 via an intermediate accessory, such as an adapter device, mounted on the camera 100. In such a form, communication control similar to at least part of communication control performed by the accessory 200 and communication control performed by the camera 100, described in the above embodiments, may be executed by the intermediate accessory. Alternatively, the intermediate accessory may be caused to function as a transmission path for outputting information corresponding to information input from the camera 100 to the main accessory and outputting information corresponding to information input from the main accessory to the camera 100. As described above, the accessory according to the invention can include a variety of accessories, such as a microphone device, a lighting device, and an adapter device. Further, the adapter device can be included in the electronic device according to the invention.

For example, in the embodiments described above, as examples of the electronic device according to the invention, the image capturing apparatus (digital camera) and the accessory mounted thereon are described, but the electronic device and the accessory according to the invention are not limited to theses. For example, as the electronic device according to the invention, there may be mentioned electronic devices having portability, such as a digital video camera and a smartphone, a wearable terminal, a vehicle-mounted camera, a security camera, and so forth. Further, insofar as the accessory is any of a variety of electronic devices that can be mounted on (connected to) these electronic devices, the present invention can be applied thereto.

Other Embodiments

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-073484, filed Apr. 23, 2021, which is hereby incorporated by reference herein in its entirety.

What is claimed is:

1. An accessory that transmits and receives data to and from an electronic device by serial communication, comprising:
   at least one processor; and
   a memory coupled to the at least one processor, the memory having instructions that, when executed by the processor, perform the operations as:
   a calculation unit configured to calculate a checksum;
   a determination unit configured to determine whether or not a checksum received from the electronic device and a first checksum calculated by the calculation unit from data received from the electronic device match;
   a control unit configured to calculate a second checksum by the calculation unit in a case where the checksum received from the electronic device and the first checksum match, and calculate a third checksum by the calculation unit in a case where the checksum received from the electronic device and the first checksum do not match; and
   a transmission unit configured to transmit the second checksum or the third checksum according to a result of determination by the determination unit.

2. The accessory according to claim 1, wherein the control unit sets the third checksum to 1's complement number of the second checksum.

3. The accessory according to claim 2, wherein in the accessory performs one communication with the electronic device by a predetermined number of bytes, and
   wherein the transmission unit transmits during one communication, after receiving the checksum from the electronic device, the second checksum or the third checksum, to the electronic device.

4. An accessory that transmits and receives data to and from an electronic device by serial communication, comprising:
   at least one processor; and
   a memory coupled to the at least one processor, the memory having instructions that, when executed by the processor, perform the operations as:
   a calculation unit configured to calculate a checksum;
   a determination unit configured to determine whether or not a checksum received from the electronic device and a first checksum calculated by the calculation unit from data received from the electronic device match;
   a control unit configured to calculate a second checksum by the calculation unit in a case where the checksum received from the electronic device and the first checksum match, and notify a checksum error to the electronic device by changing an output level at a communication terminal for the serial communication in a case where the checksum received from the electronic device and the first checksum do not match; and
a transmission unit configured to transmit the second checksum to the electronic device in the case where the checksum received from the electronic device and the first checksum match.

5. An accessory that transmits and receives data to and from an electronic device by serial communication, comprising:
at least one processor; and
a memory coupled to the at least one processor, the memory having instructions that, when executed by the processor, perform the operations as:
a calculation unit configured to calculate a checksum;
a determination unit configured to determine whether or not a checksum received from the electronic device and a first checksum calculated by the calculation unit from data received from the electronic device match;
a control unit configured to calculate a second checksum by the calculation unit in a case where the checksum received from the electronic device and the first checksum match, and notify a checksum error to the electronic device by starting over communication with the electronic device in a case where the checksum received from the electronic device and the first checksum do not match; and
a transmission unit configured to transmit the second checksum to the electronic device in the case where the checksum received from the electronic device and the first checksum match.

6. An accessory that transmits and receives data to and from an electronic device by serial communication, comprising:
at least one processor; and
a memory coupled to the at least one processor, the memory having instructions that, when executed by the processor, perform the operations as:
a calculation unit configured to calculate a checksum;
a determination unit configured to determine whether or not a checksum received from the electronic device and a first checksum calculated by the calculation unit from data received from the electronic device match;
a control unit configured to calculate a second checksum by the calculation unit in a case where the checksum received from the electronic device and the first checksum match, and notify a checksum error to the electronic device by resetting the accessory in a case where the checksum received from the electronic device and the first checksum do not match; and
a transmission unit configured to transmit the second checksum to the electronic device in the case where the checksum received from the electronic device and the first checksum match.

7. An accessory that transmits and receives data to and from an electronic device by serial communication, including:
a storage unit configured to store accessory information, the storage unit comprising:
a first area configured to store a first checksum which is a checksum of the whole of the accessory information; and
a second area configured to store a second checksum which is a checksum of part of the accessory information,
wherein the first area is set to an end of an area of the storage unit, for storing the accessory information,
wherein the second area is set to a predetermined area of the storage unit excluding the end of the area for storing the accessory information, and
wherein the second checksum is a fixed value.

8. An electronic device that transmits and receives data to and from an accessory by serial communication, comprising:
at least one processor; and
a memory coupled to the at least one processor, the memory having instructions that, when executed by the processor, perform the operations as:
a calculation unit configured to calculate a first checksum of data transmitted to the accessory;
a transmission unit configured to transmit the data and the first checksum to the accessory; and
a control unit configured to, in a case where during one communication of a predetermined number of bytes, a second checksum received from the accessory after transmitting the first checksum to the accessory, indicates a checksum error, transmit the data to the accessory again,
wherein the instructions, when executed, cause the at least one processor to, during one communication of the predetermined number of bytes, receive predetermined data from the accessory while transmitting the first checksum to the accessory, the predetermined data being different from the second checksum, and
wherein the second checksum is received from the accessory by the at least one processor after the predetermined data is received.

9. A communication system including:
an accessory, as recited in claim 1,
an electronic device,
the electronic device comprising:
at least one processor; and
a memory coupled to the at least one processor, the memory having instructions that, when executed by the processor, perform the operations as:
a calculation unit configured to calculate a checksum of data transmitted to the accessory;
a transmission unit configured to transmit the data and the checksum to the accessory; and
a control unit configured to, in a case where the third checksum is received from the accessory, transmit the data transmitted to the accessory, again.

10. A communication system including:
an accessory, as recited in claim 4,
an electronic device,
the electronic device comprising:
at least one processor; and
a memory coupled to the at least one processor, the memory having instructions that, when executed by the processor, perform the operations as:
a calculation unit configured to calculate a checksum of data transmitted to the accessory;
a transmission unit configured to transmit the data and the checksum to the accessory; and
a control unit configured to, in a case where the checksum error is notified from the accessory, transmit the data transmitted to the accessory, again.

11. A communication system including:
an accessory, as recited in claim 5,
an electronic device,
the electronic device comprising:
at least one processor; and
a memory coupled to the at least one processor, the memory having instructions that, when executed by the processor, perform the operations as:
a calculation unit configured to calculate a checksum of data transmitted to the accessory;
a transmission unit configured to transmit the data and the checksum to the accessory; and
a control unit configured to, in a case where the checksum error is notified from the accessory, transmit the data transmitted to the accessory, again.

12. A communication system including:
an accessory, as recited in claim 6,
an electronic device,
the electronic device comprising:
at least one processor; and
a memory coupled to the at least one processor, the memory having instructions that, when executed by the processor, perform the operations as:
a calculation unit configured to calculate a checksum of data transmitted to the accessory;
a transmission unit configured to transmit the data and the checksum to the accessory; and
a control unit configured to, in a case where the checksum error is notified from the accessory, transmit the data transmitted to the accessory, again.

13. A communication system including:
an accessory, as recited in claim 7,
an electronic device,
the electronic device comprising:
at least one processor; and
a memory coupled to the at least one processor, the memory having instructions that, when executed by the processor, perform the operations as:
a determination unit configured to acquire the first checksum during initial communication with the accessory, and determine, based on the received first checksum, whether or not the accessory is compatible with the electronic device; and
a control unit configured to, in a case where the accessory is not compatible with the electronic device, perform error handling.

14. A communication system including:
an accessory, as recited in claim 7,
an electronic device,
the electronic device comprising:
at least one processor; and
a memory coupled to the at least one processor, the memory having instructions that, when executed by the processor, perform the operations as:
a determination unit configured to acquire the second checksum in a case where an event has occurred in the electronic device after establishing communication with the accessory, and determine, based on the received second checksum, whether or not the accessory is compatible with the electronic device; and
a control unit configured to, in a case where the accessory is not compatible with the electronic device, perform error handling.

15. A method of controlling an accessory that transmits and receives data to and from an electronic device by serial communication, comprising:
calculating a first checksum from data received from the electronic device deice;
determining whether or not a checksum received from the electronic device and the first checksum match;
calculating a second checksum in a case where the checksum received from the electronic device and the first checksum match, and calculating a third checksum in a case where the checksum received from the electronic device and the first checksum do not match; and
transmitting the second checksum or the third checksum according to a result of determination.

16. A method of controlling an accessory that transmits and receives data to and from an electronic device by serial communication, comprising:
calculating a first checksum from data received from the electronic device;
determining whether or not the checksum received from the electronic device and the first checksum match;
calculating a second checksum in a case where the checksum received from the electronic device and the first checksum match and transmitting the second checksum to the electronic device; and
notifying a checksum error to the electronic device by changing an output level at a communication terminal for the serial communication in a case where the checksum received from the electronic device and the first checksum do not match.

17. A method of controlling an accessory that transmits and receives data to and from an electronic device by serial communication, comprising:
calculating a first checksum from data received from the electronic device;
determining whether or not the checksum received from the electronic device and the first checksum match;
calculating a second checksum in a case where the checksum received from the electronic device and the first checksum match and transmitting the second checksum to the electronic device; and
notifying a checksum error to the electronic device by starting over communication with the electronic device in a case where the checksum received from the electronic device and the first checksum do not match.

18. A method of controlling an accessory that transmits and receives data to and from an electronic device by serial communication, comprising:
calculating a first checksum from data received from the electronic device;
determining whether or not the checksum received from the electronic device and the first checksum match;
calculating a second checksum in a case where the checksum received from the electronic device and the first checksum match and transmitting the second checksum to the electronic device; and
notifying a checksum error to the electronic device by resetting the accessory in a case where the checksum received from the electronic device and the first checksum do not match.

19. A method of controlling an electronic device that transmits and receives data to and from an accessory by serial communication, comprising:
calculating a first checksum of data transmitted to the accessory;
transmitting the data and the first checksum to the accessory;

transmitting, in a case where during one communication of a predetermined number of bytes, a second checksum received from the accessory after transmitting the checksum to the accessory, indicates a checksum error, the data to the accessory again; and during one communication of the predetermined number of bytes, receiving predetermined data from the accessory while transmitting the first checksum to the accessory, the predetermined data being different from the second checksum, wherein the second checksum is received from the accessory after the predetermined data is received.

20. A non-transitory computer-readable storage medium storing a program for causing a computer to execute a method of controlling an accessory that transmits and receives data to and from an electronic device by serial communication, the method comprising:

calculating a first checksum from data received from the electronic device;

determining whether or not a checksum received from the electronic device and the first checksum match;

calculating a second checksum in a case where the checksum received from the electronic device and the first checksum match, and calculating a third checksum in a case where the checksum received from the electronic device and the first checksum do not match; and transmitting the second checksum or the third checksum according to a result of determination.

21. A non-transitory computer-readable storage medium storing a program for causing a computer to execute a method of controlling an accessory that transmits and receives data to and from an electronic device by serial communication, the method comprising:

calculating a first checksum from data received from the electronic device;

determining whether or not the checksum received from the electronic device and the first checksum match;

calculating a second checksum in a case where the checksum received from the electronic device and the first checksum match and transmitting the second checksum to the electronic device; and notifying a checksum error to the electronic device by changing an output level at a communication terminal for the serial communication in a case where the checksum received from the electronic device and the first checksum do not match.

22. A non-transitory computer-readable storage medium storing a program for causing a computer to execute a method of controlling an accessory that transmits and receives data to and from an electronic device by serial communication, the method comprising:

calculating a first checksum from data received from the electronic device;

determining whether or not the checksum received from the electronic device and the first checksum match;

calculating a second checksum in a case where the checksum received from the electronic device and the first checksum match and transmitting the second checksum to the electronic device; and notifying a checksum error to the electronic device by starting over communication with the electronic device in a case where the checksum received from the electronic device and the first checksum do not match.

23. A non-transitory computer-readable storage medium storing a program for causing a computer to execute a method of controlling an accessory that transmits and receives data to and from an electronic device by serial communication, the method comprising:

calculating a first checksum from data received from the electronic device;

determining whether or not the checksum received from the electronic device and the first checksum match;

calculating a second checksum in a case where the checksum received from the electronic device and the first checksum match and transmitting the second checksum to the electronic device; and notifying a checksum error to the electronic device by resetting the accessory in a case where the checksum received from the electronic device and the first checksum do not match.

24. A non-transitory computer-readable storage medium storing a program for causing a computer to execute a method of controlling an electronic device by serial communication, the method comprising:

calculating a first checksum of data transmitted to the accessory;

transmitting the data and the first checksum to the accessory; and transmitting, in a case where during one communication of a predetermined number of bytes, a second checksum received from the accessory after transmitting the checksum to the accessory indicates a checksum error, the data to the accessory again; and during one communication of the predetermined number of bytes, receiving predetermined data from the accessory while transmitting the first checksum to the accessory, the predetermined data being different from the second checksum, wherein the second checksum is received from the accessory after the predetermined data is received.

25. The electronic device according to claim 8, wherein the instructions, when executed, cause the at least one processor to maintain the one communication of the predetermined number of bytes, after the at least one processor transmits the first checksum to the accessory.

26. The electronic device according to claim 8, wherein the instructions, when executed, cause the at least one processor to control timing of data transmission to the accessory and timing of data receipt from the accessory, based on a common clock signal.

27. The electronic device according to claim 25, wherein the serial communication between the electronic device and the accessory is performed with a communication protocol in which transmission of data from each of the electronic device and the accessory to another is performed in parallel with receipt of data transmitted from the another by the each.

* * * * *